(12) United States Patent
Kashiwagi et al.

(10) Patent No.: US 7,662,728 B2
(45) Date of Patent: Feb. 16, 2010

(54) SUBSTRATE PROCESSING METHOD

(75) Inventors: Yusaku Kashiwagi, Amagasaki (JP); Yasuhiro Oshima, Amagasaki (JP); Yoshihisa Kagawa, Yokohama (JP); Gishi Chung, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 203 days.

(21) Appl. No.: 11/431,720

(22) Filed: May 11, 2006

(65) Prior Publication Data
US 2006/0205191 A1    Sep. 14, 2006

Related U.S. Application Data

(63) Continuation of application No. PCT/JP2004/016541, filed on Nov. 8, 2004.

(30) Foreign Application Priority Data

Nov. 11, 2003  (JP)  ............................. 2003-381591
Dec. 16, 2003  (JP)  ............................. 2003-417896

(51) Int. Cl.
*H01L 21/31* (2006.01)
(52) U.S. Cl. .................. 438/779; 438/780; 438/788; 438/790; 438/798
(58) Field of Classification Search ......... 438/778–787, 438/758, 790; 257/E21.266, E21.292
See application file for complete search history.

(56) References Cited

U.S. PATENT DOCUMENTS

| 7,326,657 | B2* | 2/2008 | Xia et al. ..................... 438/790 |
| 2001/0030369 | A1 | 10/2001 | MacNeil et al. |
| 2002/0055275 | A1 | 5/2002 | MacNeil |
| 2004/0092086 | A1* | 5/2004 | Sakamoto et al. ........... 438/485 |
| 2008/0014369 | A1* | 1/2008 | Chang et al. ................. 427/535 |
| 2008/0132087 | A1* | 6/2008 | Xia et al. ..................... 438/789 |

FOREIGN PATENT DOCUMENTS

| GB | 2 361 808 | 10/2001 |
| JP | 10-144666 | 5/1998 |
| JP | 10-144668 | 5/1998 |
| JP | 2003-503849 | 1/2003 |
| JP | 2003-037105 | 2/2003 |
| WO | WO 00/51174 | 8/2000 |
| WO | WO 01/01472 | 1/2001 |
| WO | WO 02/059956 | 8/2002 |

* cited by examiner

*Primary Examiner*—Dung A. Le
(74) *Attorney, Agent, or Firm*—Oblon, Spivak, McClelland, Maier & Neustadt, L.L.P.

(57) ABSTRACT

A method of forming a low-K dielectric film, comprises the steps of placing a substrate carrying thereon a low-K dielectric film on a stage, heating the low-K dielectric film on the stage, processing the low-K dielectric film by plasma of a processing gas containing a hydrogen gas, the plasma being excited while supplying the processing gas over the low-K dielectric film, wherein the plasma is excited within 90 seconds after placing the substrate upon the stage.

20 Claims, 18 Drawing Sheets

SUBSTRATE PROCESSING METHOD

CROSS-REFERENCE TO RELATED APPLICATIONS

The present invention is a continuation application filed under 35 U.S.C. 111(a) claiming benefit under 35 U.S.C. 120 and 365(c) of PCT application PCT/JP2004/016541 field on Nov. 8, 2004 based on Japanese priority applications 2003-381591 filed on Nov. 11, 2003 and 2003-417896 filed on Dec. 16, 2003, the entire contents of each are incorporated by reference.

BACKGROUND OF THE INVENTION

The present invention generally relates to the art of substrate processing and more particularly to a substrate processing method used for forming an insulation film in the fabrication process of a semiconductor device.

With increase of performance in recent semiconductor devices, there arises a situation with such recent high-speed semiconductor devices that use a multilayer interconnection structure in that interconnection patterns in the multilayer interconnection structure are disposed close with each other as a result of device miniaturization. Associated with this, there is caused a problem of wiring delay by the parasitic capacitance formed between these interconnection patterns. Such parasitic capacitance changes in inverse proportion to the distance between the interconnection patterns and is proportional to the specific dielectric constant of the insulation film existing between the interconnection patterns.

Thus, in order to solve the problem of wiring delay in the multilayer interconnection structure and to decrease the parasitic capacitance therein, investigations are being made to use a material of low specific dielectric constant (low-K) in the multilayer interconnection structure for the interlayer insulation film.

The specific dielectric constant of a $CVD-SiO_2$ film that has been used conventionally as an interlayer insulation film is about 3.5-4. Thus, in order to decrease the specific dielectric constant further, it is practiced in the art to add fluorine to the $CVD-SiO_2$ film to form an SiOF film. With this approach, however, it is difficult to attain the specific dielectric constant of lower than the 3.3-3.5, while this degree of decrease of the specific dielectric constant is not sufficient for recent high-density semiconductor integrated circuit devices, and there are cases in which necessary operational speed is not attained.

Thus, there is proposed an insulation film of further lower dielectric constant formed by plasma CVD process with the use of organic silane gas or an insulation film formed by SOD (spin-on-deposition) process, to provide a so called low-K interlayer insulation film. Further, there is proposed a porous film, in which any of these films are made porous. Thus, intensive efforts are being made to develop a low-K interlayer insulation film having a specific dielectric constant of 2.5 or less.

It should be noted that an insulation film formed by a plasma CVD process has a large dielectric constant immediately after the film formation process thereof, and thus, there are cases in which it becomes necessity to reduce the specific dielectric constant by way of predetermined processing such as plasma processing, or the like. Further, such low-K insulation film formed by a plasma CVD process tends to suffer from the problem of poor mechanical strength, and there are cases it is necessary to improve the mechanical strength by way of predetermined processing.

REFERENCES

Patent Reference 1 United States Patent Application Publication 2001/0030369 official gazette
Patent Reference 2 United States Patent Application Publication 2002/0055275 official gazette
Patent Reference 3 British Patent 2,361,808
Patent Reference 4 WO00/51174 official gazette
Patent Reference 5 WO01/01472 official gazette

SUMMARY OF THE INVENTION

However, there still remain the cases in which mechanical strength of the film is insufficient even when the insulation film formed by a plasma CVD process is applied subsequently with such predetermined processing for reducing the dielectric constant, and there have been cases in which it is difficult to achieve the desired low dielectric constant and large mechanical strength at the same time in an insulation film.

Accordingly, it is an object of the present invention to provide a novel and useful film formation method wherein the foregoing problems are eliminated.

A more specific object of the present invention is to provide a film formation process capable of decreasing the dielectric constant of an insulation film deposited by a plasma CVD process while using an organic silane gas and at the same time capable of improving the mechanical strength thereof.

According to a first aspect of the present invention, there is provided a method of forming a low-K dielectric film, comprising the steps of:

placing a substrate carrying thereon a low-K dielectric film on a stage;

heating said low-K dielectric film on said stage;

processing said low-K dielectric film by plasma of a processing gas containing a hydrogen gas, said plasma being excited while supplying said processing gas over said low-K dielectric film;

wherein said plasma is excited within 90 seconds after placing said substrate upon said stage.

According to a second aspect of the present invention, there is provided a method of cleaning a processing vessel used for forming an insulation film containing Si and C on a substrate to be processed, by removing said insulation film from an inner wall of said processing vessel, comprising the steps of:

exciting first plasma of a first processing gas containing oxygen in said processing vessel; and exciting second plasma of a second processing gas containing fluorine in said processing vessel.

According to a third aspect of the present invention, there is provided a substrate processing method, comprising the steps of:

forming, in a processing vessel, an insulation film containing Si and C on a substrate to be processed; and cleaning said processing vessel after said step of forming said insulation film, wherein said step of cleaning said processing vessel comprises:

a first step of exciting plasma of a first processing gas containing oxygen in said processing vessel; and a second step of exciting plasma of a second processing gas containing fluorine in said processing vessel.

According to a fourth aspect of the present invention, there is provided a method of forming a low-K dielectric film, comprising the steps of:

forming a low-K dielectric film on a substrate by exciting first plasma of a first processing gas containing an organic silane gas; and processing said low-K dielectric film by exciting second plasma of a processing gas containing a hydrogen gas, said second plasma being excited by supplying a second processing gas containing a hydrogen gas to a space over said substrate where said second plasma is to be excited, wherein said second plasma has an electron temperature of 0.7-2 eV, said low-K dielectric film having a decreased specific dielectric constant after said step of processing said low-K dielectric film with said second plasma.

According to the present invention, it becomes possible to decrease the dielectric constant and improve the mechanical strength of the insulation film formed by using an organic silane gas.

Other objects and further features of the present invention will become apparent from the following detailed description when read in conjunction with attached drawings.

DETAILED DESCRIPTION OF THE PREFERRED EMBODIMENTS

Next, the present invention will be explained for preferred embodiments with reference to the drawings.

First Embodiment

Figure 1:
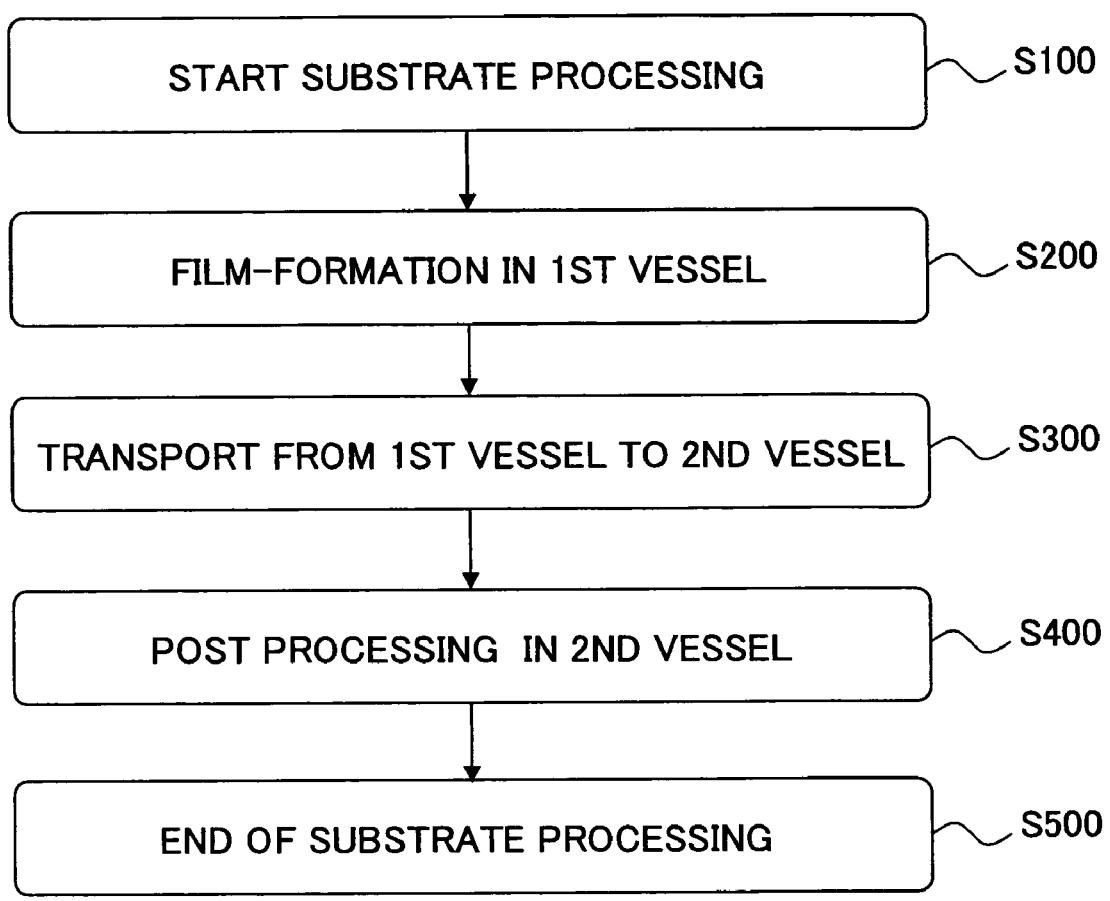
FIG. 1 is a flowchart showing a substrate processing method according to first embodiment of the present invention.

FIG. 1 is a diagram showing the flowchart of a substrate processing method according to a first embodiment of the present invention.

Referring to FIG. 1, a substrate processing is started with a step 100 (designated as S100 in the drawing: similar designation will be used throughout the drawings), and an insulation film is deposited on the substrate to be processed in a step 200 while using a first processing vessel to be described later. In the present case, an insulation film (a SiCO(H) film) is formed on the substrate to be processed by a plasma CVD process by introducing a first processing gas containing an organic silane gas, such as a trimethyl silane ($SiH(CH_3)_3$) gas, as a first processing gas and further by exciting plasma.

Next, in a step 300, the substrate thus formed with the insulation film is transported from the first processing vessel to a second processing vessel to be described later. Thereby, it should be noted that the transportation is carried out by a transportation arm of a vacuum transportation vessel to be described later.

Next, in a step 400, plasma processing is conducted in the second the processing vessel for improving mechanical strength and further for reducing the specific dielectric constant of the insulation film thus formed on the substrate.

In this process, the plasma excitation process is conducted for example by introducing a hydrogen gas into the second processing vessel as the second processing gas, and as a result of the plasma processing of the insulation film, excess alkyl group (—CHx) and excess hydroxyl group (—OH) in the insulation film are removed and the specific dielectric constant of the insulation film is reduced. At the same time, the mechanical strength of the insulation film is improved and the film quality is improved.

The substrate processing is completed with a step 500.

It should be noted that the insulation film thus formed on the substrate has a relatively high specific dielectric constant of about 4 immediately after formation thereof in the first processing vessel with the step 200, while the insulation film of this specific dielectric constant is insufficient for a low-K interlayer insulation film used for high-speed semiconductor devices.

Thus, in order to decrease the specific dielectric constant of the insulation film and to improve the film quality such as the mechanical strength of the insulation film, the process of FIG. 1 carries out a post-processing process including a plasma processing, by introducing a hydrogen gas into the second processing vessel.

Further, in the case of forming the film on the substrate to be processed, it should be noted that the temperature of the substrate is set to 100° C. or less, typically at the room temperature, while in the case of the plasma processing of the insulation film thus formed, it is preferable to set the temperature of the substrate to 350° C. or more.

Thus, in the case of conducting the plasma processing after the film formation process conducted in the first processing vessel by using the same first processing vessel, there is a need of elevating the temperature of the substrate to be processed, while such a step of elevating the substrate temperature requires a substantial time. Thus, it is practically not possible or realistic to conduct the plasma processing of the insulation film formed by the film formation processing in the first processing vessel, by using the same first processing vessel and by elevating the substrate temperature therein.

On the other hand, when the plasma processing is conducted after the film formation processing in the first processing vessel by transporting the substrate to the second processing vessel as in the case of the present embodiment, it becomes possible to carry out the substrate processing efficiently by elevating the temperature of the stage that holds the substrate to be processed in the second processing vessel to the predetermined substrate temperature beforehand.

Also, this approach of the present embodiment of separating the processing vessel for the film formation and the processing vessel for the plasma processing is preferable in view of the optimizing the timing of the temperature elevation and plasma excitation for achieving the desired decrease of specific dielectric constant of the insulation film as will be explained later. Such optimized plasma processing method will be described later.

Next, the substrate processing apparatus used for carrying out the substrate processing shown in FIG. 1 will be explained with reference to FIGS. 2-4.

Figure 2:
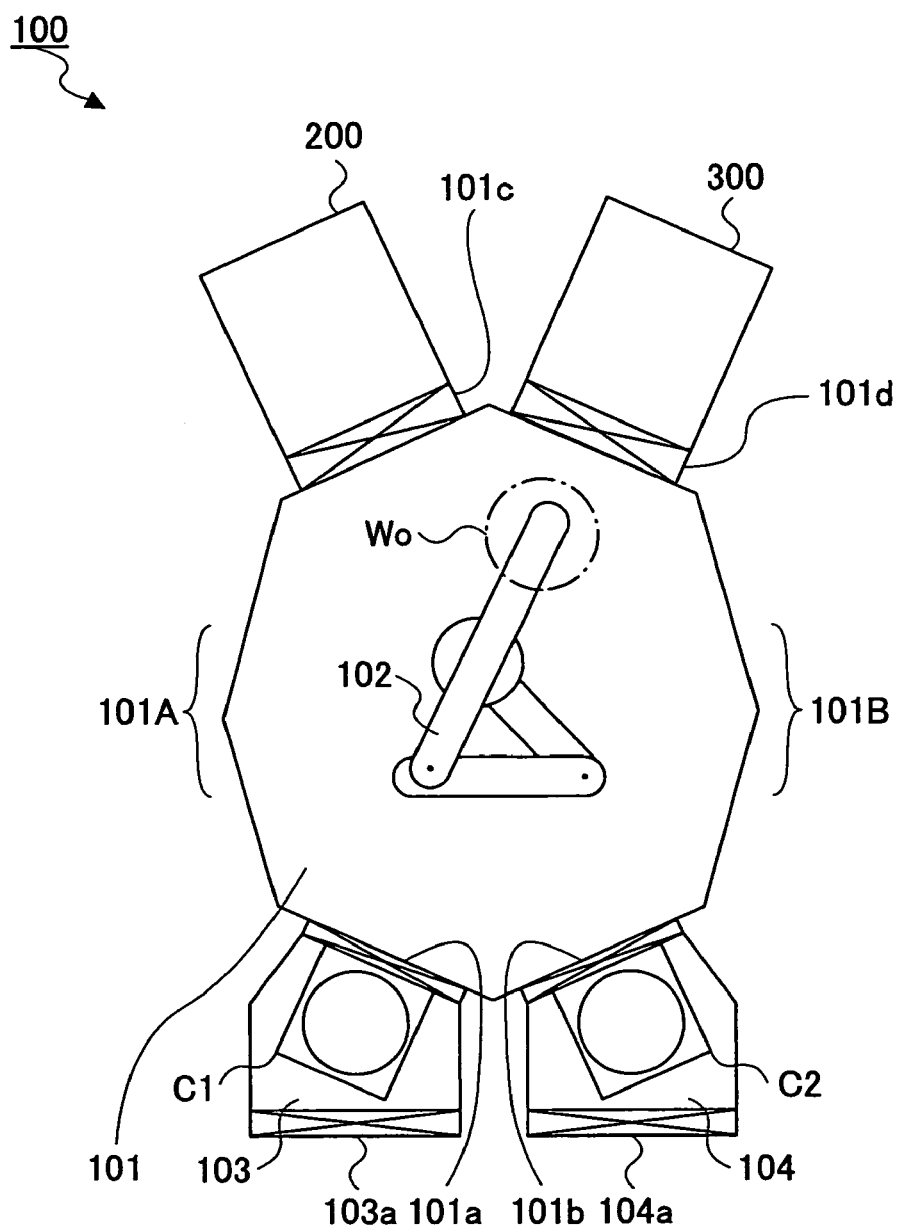
FIG. 2 is a diagram showing an example of the substrate processing apparatus used for substrate processing in the first embodiment.
Figure 2:
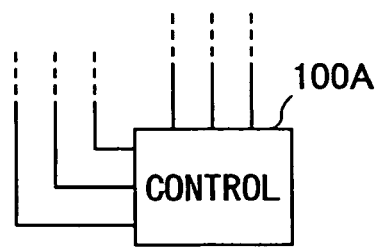

FIG. 2 is a plan view diagram showing a substrate processing apparatus 100 used with the present embodiment for carrying out the substrate processing shown in FIG. 1 schematically.

Referring to FIG. 2, the substrate processing apparatus 100 includes a vacuum transportation chamber 101 including therein a movable transportation arm 102, wherein the substrate processing apparatus 100 further includes a processing chamber 200 used as the first processing vessel for the film formation of the insulation film on the substrate to be processed, a processing chamber 300 used as the second processing vessel for the plasma processing of the insulation film, and load-lock chambers 103 and 104, such that the processing chambers 200, 300 and the load-lock chambers 103 and 104 are coupled to the vacuum transportation chamber 101.

Further, there is provided an evacuation means not illustrated in the processing chamber 200, the processing chamber 300, the vacuum transportation chamber 101, the load-lock chamber 103 and the load-lock chamber 104 for evacuating the interior thereof to a depressurized state.

Thereby, it should be noted that the processing chamber 200, the processing chamber 300, the load-lock chamber 103 and the load-lock chamber 104 are connected to the vacuum transportation chamber 101 via the gate valves 101c, 110d, 101a and 101b respectively, and the foregoing gate valves are opened in the event of transporting the substrate to be processed therethrough.

In the load-lock chambers 103 and 104, there are provided doors 103a and 104a respectively. Thus, by opening the door 103a, it becomes possible to load a wafer cassette C1 holding therein plural substrates to be processed into the load-lock chamber 103. Similarly, by opening the door 103b, it becomes possible to load a wafer cassette C2 holding therein plural substrates to be processed into the load-lock chamber 104.

In the case of carrying out the foregoing substrate processing with the substrate processing apparatus 100, a substrate WO to be processed is transported to the processing chamber 200 from the cassette C1 or C2 via the vacuum transportation chamber 101 by way of the transportation arm 102, wherein the substrate finished with the film formation processing in the processing chamber 200 is transported to the processing chamber 300 through the vacuum transportation chamber 101 by way of the transportation arm 102. Further, the substrate finished with the plasma processing in the processing chamber 300 is returned to the cassette C1 again. Alternatively, it is stored in the cassette C2 of the load-lock chamber 104.

Further, while FIG. 2 shows an example of using two processing vessels connected to the vacuum transportation chamber, it is also possible to connect more processing vessels to surfaces 101A or 101B of the vacuum transportation chamber 101 to form a multi-chamber system.

Further, it should be noted that the operation of the substrate processing apparatus 100 corresponding to the substrate processing shown in the flowchart of the FIG. 1 is controlled by a control means 100A that includes a storage medium and a computer (CPU). For example, the operation such as loading of the substrate to be processed, processing in the processing vessel, unloading of the substrate after the processing, or the like, is controlled by the control means 100A. Thereby, the operation of the control means 100A is controlled by a program stored in the storage medium.

Next, explanation will be made with regard to the processing chamber 200 and the processing chamber 300.

Figure 3:
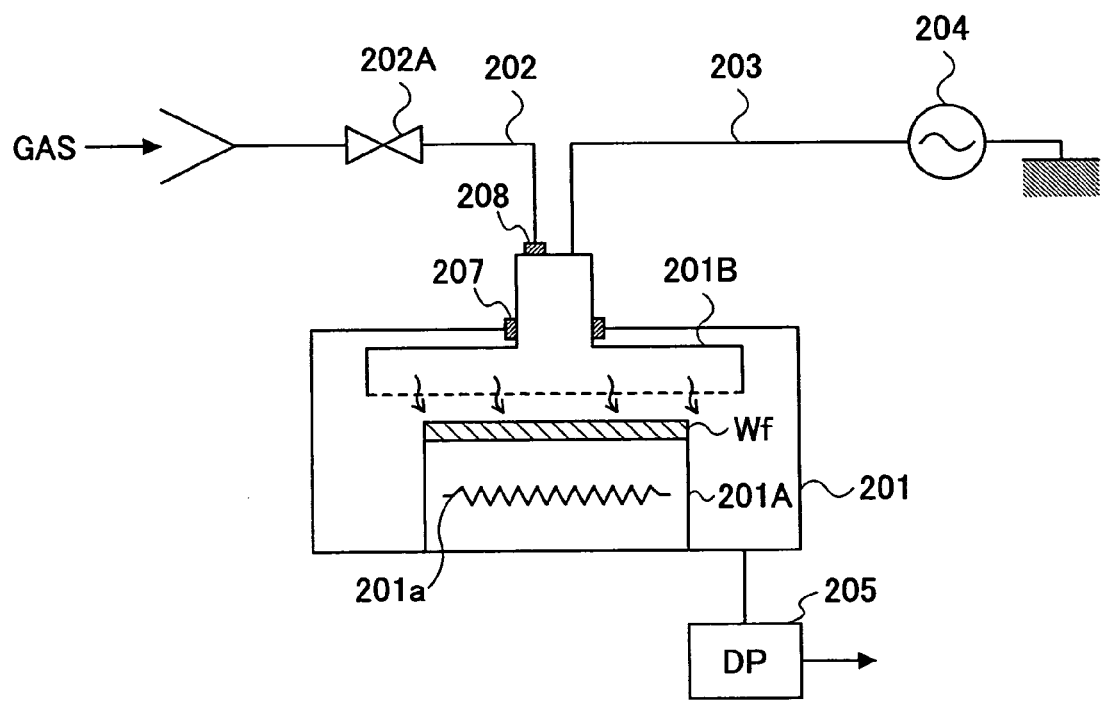
FIG. 3 is a first diagram showing the cross-sectional view of the processing vessel used with the substrate processing apparatus of FIG. 2 schematically.

FIG. 3 is a cross-sectional diagram showing the construction of the processing chamber 200 schematically.

Referring to FIG. 3, the processing chamber 200 includes a processing vessel 201 of aluminum or aluminum alloy and a stage 201A provided inside the processing vessel 201 for holding a substrate Wf to be processed thereon. Thereby, a heater 201a is embedded inside the stage 201A, and with this, the stage 201A can heat the substrate Wf held thereon.

It should be noted that the interior of the processing vessel 201 is evacuated by an evacuation means 205 such as a vacuum pump connected to the processing vessel 201. Further, a shower head 201B is provided on the top part of the processing vessel 201 and a first processing gas containing trimethyl silane is supplied from a gas line 202 to the processing vessel 201 via the shower head 201B by opening a valve 202A provided to the gas line 202.

Further, a high frequency power supply 204 is connected to the shower head 201B electrically via a power supply line 203, and it becomes possible to excite high frequency plasma in the processing vessel 201 by supplying the high frequency electric power to the shower head 201B. Here, it should be noted that the shower head 201B and the processing vessel 201 are insulated be by an insulation component 207 and the gas line 202 and the shower head 201B are insulated by an insulation component 208.

In FIG. 3, illustration of the substrate in/out opening provided in the processing vessel 201 in correspondence to the gate valve 101c is omitted.

Formation of the insulation film on the substrate Wf in the processing chamber 200 is conducted as follows.

First, the valve 202A is opened and an organic silane gas such as a trimethyl silane gas, an oxygen gas and an inert gas such as an Ar gas are supplied to the processing vessel 201 via the gas line 202 connected to respective gas sources not illustrated with respective flow rates of 100 sccm, 100 sccm and 600 sccm as the first processing gas. Further, the pressure in the processing vessel 201 is set to 100 Pa.

Next, a high frequency electric power of 250 W is supplied to the shower head 201B from the high frequency power supply 204 and high frequency plasma is excited inside the processing vessel 201. In the present embodiment, the frequency of 27 MHz is used, while it is possible and preferable to use the frequency of 13-60 MHz for the high frequency power.

Further, it is preferable to set the temperature of the substrate to be processed Wf to 100° C. or less, wherein the present embodiment uses the substrate temperature of 25° C. (room temperature).

Here, there is caused a decomposition reaction of the processing gas by the plasma thus excited, and deposition of an insulation film takes place on the substrate, wherein the insulation film thus deposited has the composition of SiCO(H) and a specific dielectric constant of 3-4.

Next, the substrate carrying the insulation film thus formed is transported to the processing chamber 300 for post-processing wherein the post-processing converts the insulation film into a low-K insulation film.

Figure 4:
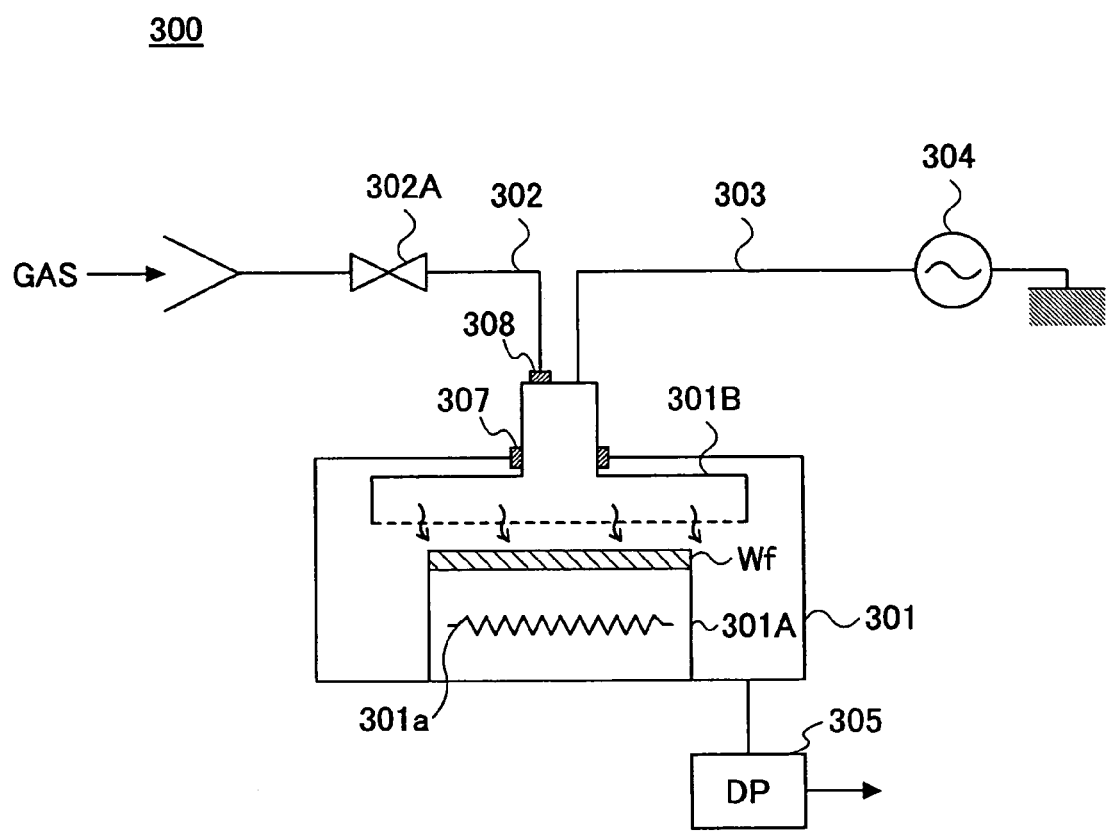
FIG. 4 is a second diagram showing the cross-sectional view of the processing vessel used with the substrate processing apparatus of FIG. 2 schematically.

FIG. 4 shows the construction of the processing chamber 300 schematically.

Referring to FIG. 4, it will be noted that the processing chamber 300 includes a processing vessel 301, a stage 301A, a heater 301a, a shower head 301B, insulation components 307 and 308, a gas line 302, a valve 302A, a power supply line 303, a high frequency power supply 304 and an evacuation means 305 wherein the processing vessel 301, the stage 301A, the heater 301a, the shower head 301B, the insulation components 307 and 308, the gas line 302, the valve 302A, the power supply line 303, the high frequency power supply 304 and the evacuation means 305 have respective constructions similar to those of the processing vessel 201, the stage 201A, the heater 201a, the shower head 201B, the insulation components 207 and 208, the gas line 202, the valve 202A, the power supply line 203, the high frequency power supply 204 and the evacuation means 205 and the description thereof will be omitted.

In the processing chamber 300 of FIG. 4, it should be noted that the gas line 302 is connected to a gas supply source of hydrogen, and thus, the chamber 302 is supplied with a hydrogen gas via the gas line 302.

The substrate formed with the insulation film in the processing chamber 200 is transported to the processing chamber 300 through the vacuum transportation chamber 101, and the insulation film of low dielectric constant is formed with the post-processing.

Next, details of the plasma processing including the post-processing carried out with the processing chamber 300 will be explained with reference to the flowchart shown in FIG. 5.

Figure 5:
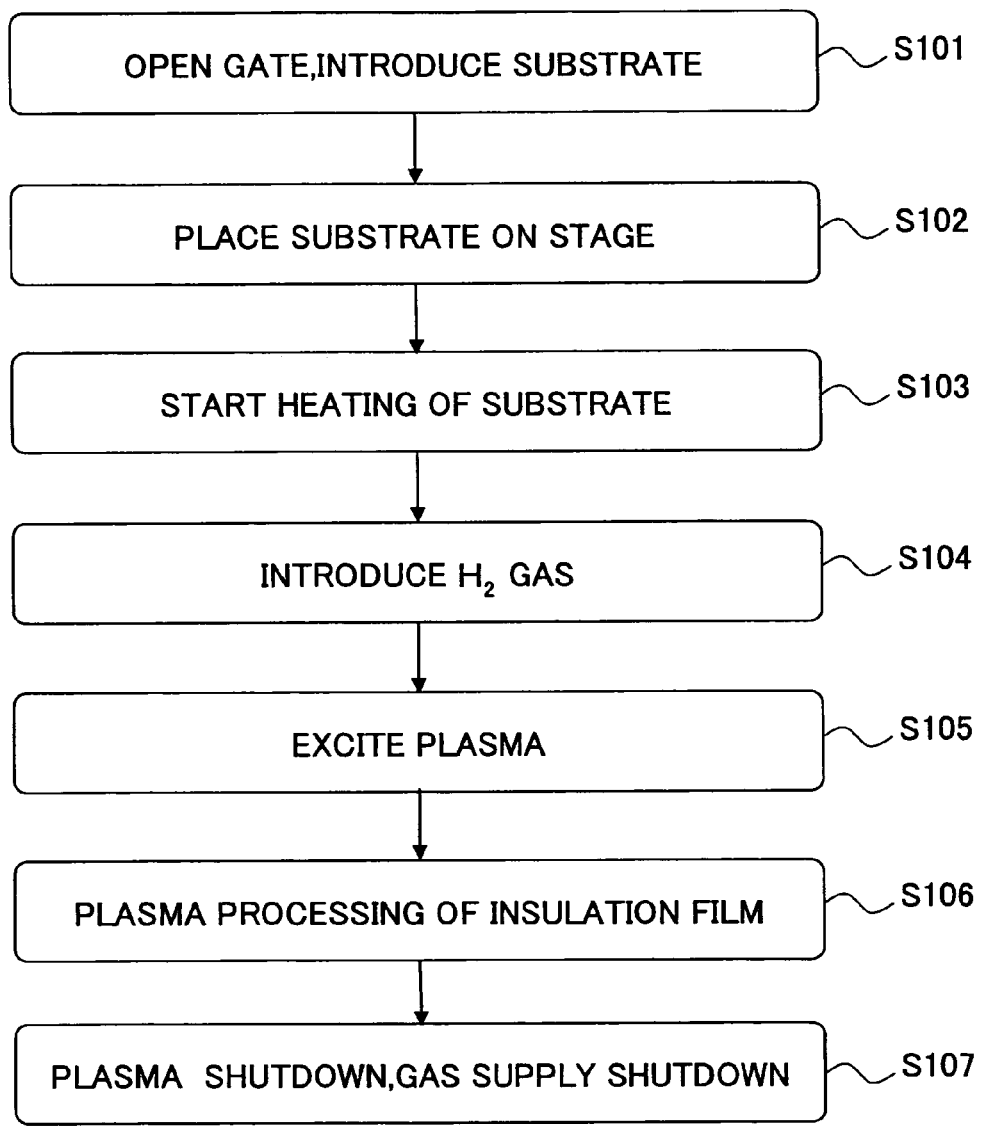
FIG. 5 is a flowchart showing the details of plasma processing in the substrate processing method of FIG. 1.

FIG. 5 is a flowchart showing the process of the post-processing carried out with the processing chamber 300.

Referring to FIG. 5, the gate valve 101d is opened with a step 101, and the substrate formed with the insulation film is transported to the processing chamber 300 from the processing chamber 200 via the vacuum transportation chamber 101. Thereby, the substrate is taken up by the transportation arm 102 and transported to the stage 301A of the processing vessel 301.

Next, in a step 102, the substrate is placed upon the stage 301A.

In more detail, there are provided lifter pins on the stage 301A in a manner movable up and down, and the substrate held by the transportation arm is unloaded upon lifter pins set to an elevated position, wherein the substrate thus landed upon the lifter pins is subsequently lowered and seated upon the stage 301A by lowering the lifter pins.

Further, the stage 301A is heated to a predetermined temperature by energizing the heater 301a embedded in the stage 301A, and thus, the substrate is held to a substrate temperature of 200-500° C., preferably 300-400° C. on the stage 301A.

Next, the valve 302A is opened in the step 104, and the hydrogen gas is introduced into the processing vessel 301 from the line 302 with a flow rate of 100-2000 sccm.

Next, in the step 105 (plasma ignition), the high frequency power is supplied to the shower head 301B from the high frequency power supply 304 with the electric power of 500-2000 W, such as 1500 W, and there is caused plasma excitation of hydrogen gas in the processing vessel 301. In the present embodiment, a frequency of 27 MHz is used for the high frequency, while it is possible and preferable to use the frequency in the range of 13.56 MHz-60 MHz for this purpose.

In the plasma process conducted in the procession vessel 301, it is preferable to conduct the plasma processing not exceeding 90 seconds after the substrate is placed upon the stage 301A. With the process thereafter, the insulation film is converted to a low-K film as a result of thermal energy and plasma energy.

Next, in the step 106, a hydrogen plasma processing is applied to the insulation film for 5 minutes, for example, and application of the high frequency electric power is stopped with step 107. Further, supply of the gas is terminated, and with this, the processing is finished.

Figure 6:
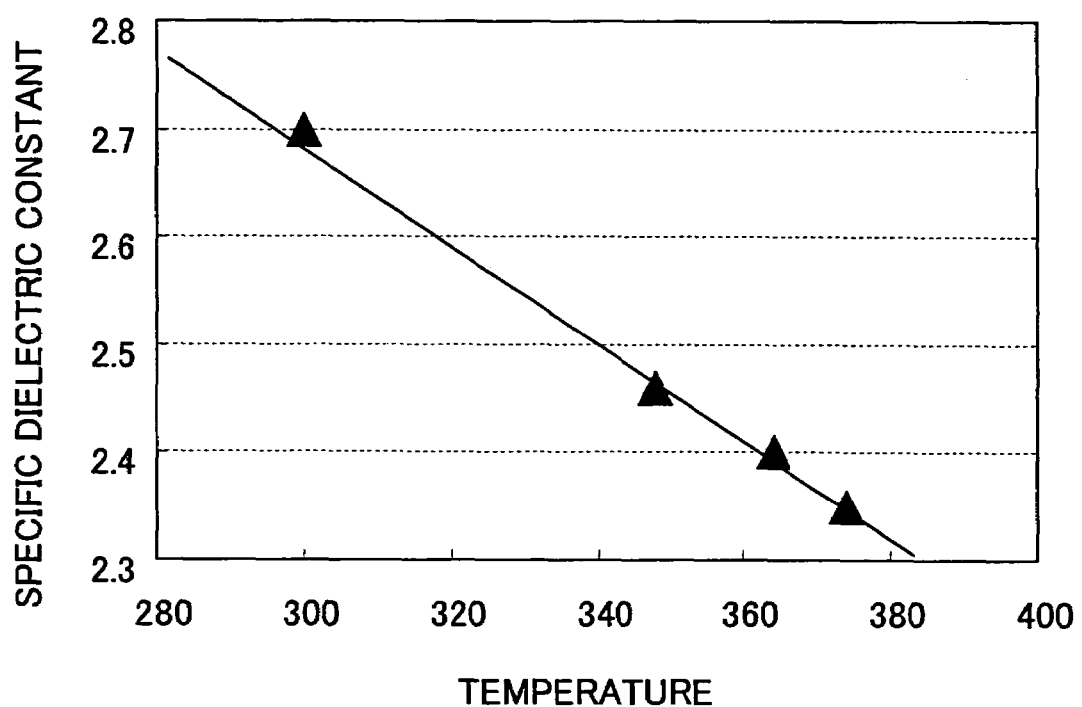
FIG. 6 is a diagram showing the relationship between the substrate temperature at the time of the plasma processing and the specific dielectric constant of the insulation film.

FIG. 6 shows the relationship between the specific dielectric constant of the insulation film formed by the substrate processing method of the present embodiment and the temperature of the substrate at the time of the plasma processing.

Referring to FIG. 6, it can be seen that the dielectric constant of the insulation film is decreased when the temperature of the substrate at the time of the plasma processing is increased. This indicates that the effect of removal of the hydroxyl group (—OH) or organic material in the insulation film by the hydrogen plasma (hydrogen ions and hydrogen radicals formed by plasma) is enhanced with increase of the temperature of the plasma processing.

On the other hand, when the temperature of the substrate is elevated in the state where there is caused no plasma excitation, there can be a case in which the reduction of specific dielectric constant of the insulation film is not attained sufficiently even when a plasma processing is applied subsequently.

For example, when the substrate is left for a long time on the stage at an elevated substrate temperature before exciting the plasma, there occurs a contraction in the insulation film, and subsequent increase in the specific dielectric constant. When this occurs, no satisfactory decrease of dielectric constant is attained for the insulation film even when the plasma processing is conducted thereafter.

Figure 7A:
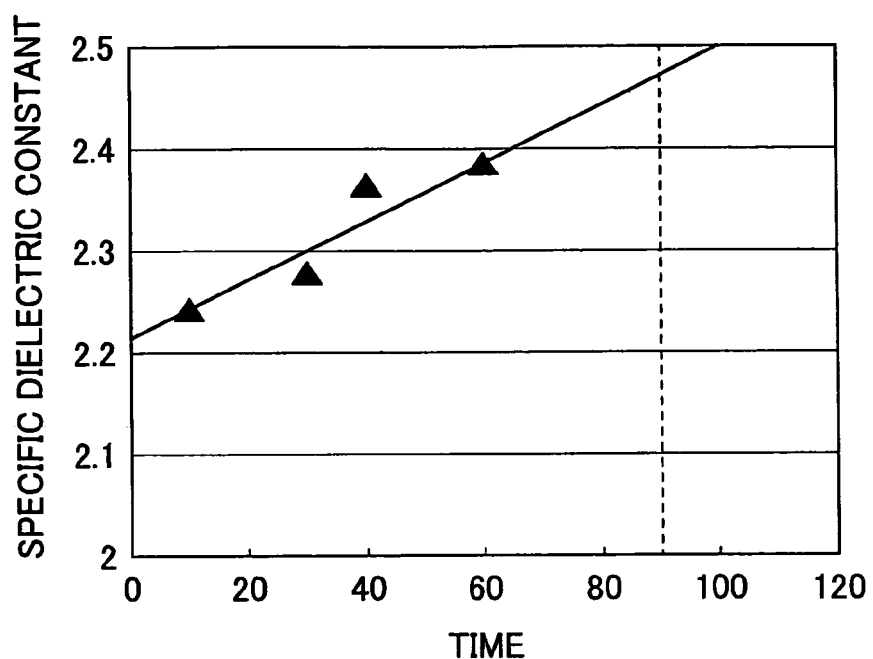
FIG. 7A is a diagram showing a change of the specific dielectric constant of the insulation film for the case in which the time after placement of the substrate in the processing apparatus to the excitation of the plasma is changed variously.

FIG. 7A shows the specific dielectric constant of the insulation film in the substrate processing method shown in FIG. 5 for the case the duration from the event of placing the substrate on the stage in correspondence to the step 102 to the event of plasma excitation (plasma ignition) corresponding to the steps 105 and 106 is changed variously.

Referring to FIG. 7A, it can be seen that the specific dielectric constant of the insulation film is increased with holding time from the event of placing the substrate to be processed on the stage to the event of plasma excitation. For example, it will be noted that a specific dielectric constant of 2.24 is obtained in the case when the holding time is 10 seconds, while in the case the holding time is set to 60 seconds, the specific dielectric constant is increased to 2.38.

Thus, it is possible to reduce the specific dielectric constant of the insulation film by minimizing the holding time of the substrate, in other words, the interval from the event of placing the substrate to be processed on the stage to the event of plasma excitation. More specifically, by setting the holding time to be 90 seconds or less, it can be seen from FIG. 7A that the specific dielectric constants of the insulation films is decreased to 2.5 or less. Further, it becomes possible to attain the specific dielectric constants of the insulation films of 2.3 or less, by setting the holding time to be 30 seconds or less.

Figure 7B:
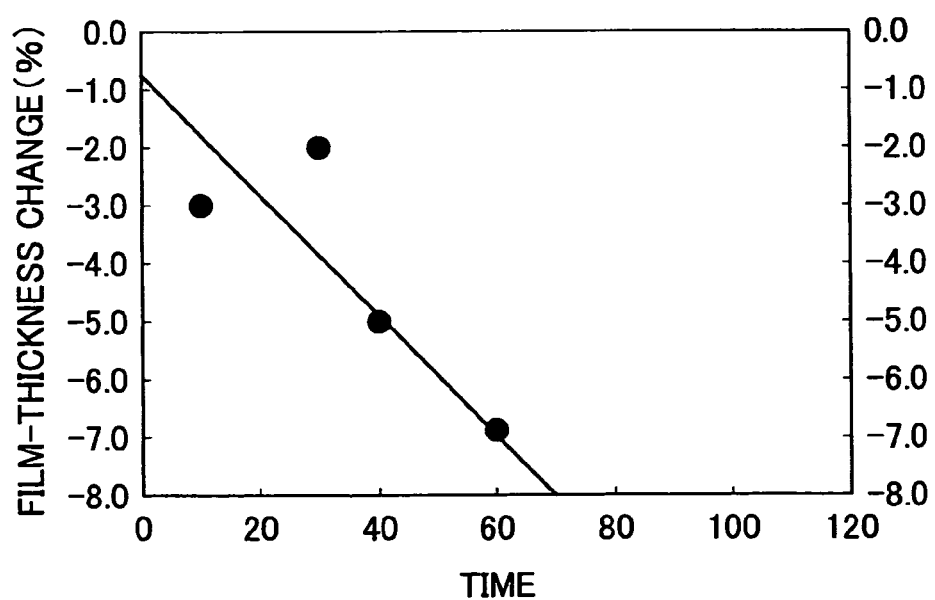
FIG. 7B is a diagram showing a change rate of film thickness of the insulation film for the case in which the time after placement of the substrate in the processing apparatus to the excitation of the plasma is changed variously.

FIG. 7B shows the rate of change of the film thickness of the insulation film (contraction rate) after the plasma processing, for the case of changing the holding time similarly to the case of FIG. 7A.

Referring to FIG. 7B, it can be seen that, while there is a variation in the numerical values, there is a tendency that the decrease of film thickness of the insulation film becomes large when the holding time from the event of placing the substrate to be processed upon the stage to the event of plasma excitation is increased.

For example, in the case the holding time is 10 seconds, it can be seen that the change rate of the film thickness is −3.0% (3.0%, in terms of decrease rate of the film thickness), while in the case where the holding time is 60 seconds, the change rate of the film thickness becomes −7.0% (7.0%, in terms of decrease rate of the film thickness). Thereby, the decrease rate of film thickness is increased.

It is believed that this increase of density of the insulation film reflects a polymerization reaction taking place in the insulation film, while this polymerization reaction is believed to be caused as a result of high temperature of the insulation film caused by the fact that the substrate is left on the stage of high temperature over a long time period. With this increase of the density, there should be caused increase of dielectric constant of the insulation film.

On the other hand, in order to decrease the dielectric constant of the insulation film by the hydrogen plasma processing, it is necessary to heat the substrate to a high temperature of typically 300° C. or more, preferably 340° C. or more, as noted before.

From this, it is clear that it is necessary to elevate the temperature of the substrate to be processed to 350° C. or more in order to decrease the specific dielectric constant of the insulation film to 2.5 or less, while it is preferable to cause plasma excitation at the same time under the foregoing processing condition that can reduce the dielectric constant of the insulation film.

Thus, when the hydrogen plasma is not excited at the time of elevating the temperature of the substrate to be processed, there would be caused polymerization in the insulation film, leading to increase of the film density and hence the dielectric constant.

Thus, it is preferable to excite the hydrogen plasma promptly when the temperature of the substrate to be processed is elevated, such that the plasma process is started before substantial commencement of such polymerization process takes place. It is thus preferable to carry out the substrate processing that modifies the film quality by the active hydrogen (H+, H*) formed as a result of the hydrogen plasma excitation, such that the reaction causing the decrease of the dielectric constant by removing therefrom excess OH group or alkyl group such as $CH_3$ becomes predominant in the insulation film.

By using the low-K insulation film of the present embodiment having the specific dielectric constant of 2.5 or less for the interlayer insulation film of a semiconductor device, for example, it is possible to reduce the parasitic capacitance between the wiring patterns and the effect of wiring delay can be reduced. Thus, the present embodiment is useful as the interlayer insulation film of the semiconductor devices of high operational speed.

While the present embodiment has been explained for the example that uses trimethyl silane as the organic silane gas, the present invention is not limited to this particular example and it is also possible to use other organic silane gas such as dimethyl dimethoxy silane (DMDMOS).

For example, it is possible to introduce the first processing gas formed of an organic silane such as dimethyl dimethoxy silane, oxygen and an inert gas such as Ar with respective flow rates of 100 sccm, 100 sccm and 150 sccm into the processing vessel 201 and supply a high frequency power to the shower head 201B with the electric power 250 W and from the high frequency power supply 204 while setting the pressure inside the processing vessel 201 to 60 Pa, such that high frequency plasma is excited in the processing vessel 201. After the processing, a similar process in the case of using trimethyl silane may be conducted.

Thus, in the case of using dimethyl dimethoxy silane for the organic silane gas, too, it is possible to obtain the effect similar to the case of using trimethyl silane as explained previously in the present embodiment.

The insulation film formed with the present embodiment shows a modulus of longitudinal elasticity (Young modulus), which is one of the elastic modula providing an index of mechanical strength, of 9.4 GPa in the case the film thickness of the insulation film is 200 nm and the specific dielectric constant is 2.3. In the case the film thickness is 350 nm and the specific dielectric constant is 2.23, the modulus of longitudinal elasticity become 8.3 GPa.

Thereby, the modulus of longitudinal elasticity takes a value of 8 GPa or more, and thus, it will be noted that the insulation film has a mechanical strength satisfying the standard required for an interlayer insulation film of semiconductor devices.

Second Embodiment

On the other hand, in the development of future high-performance semiconductor devices, it is expected that the number of the layers of the interconnection layers is increased. Also, in relation to the prospect use the films having a large stress therein, it is preferable that the insulation film has a higher mechanical strength.

Thus, in order to improve the mechanical strength of the insulation film further, it is possible to carry out the plasma processing of the insulation film with the processing vessel 10 to be explained next.

Figure 8:
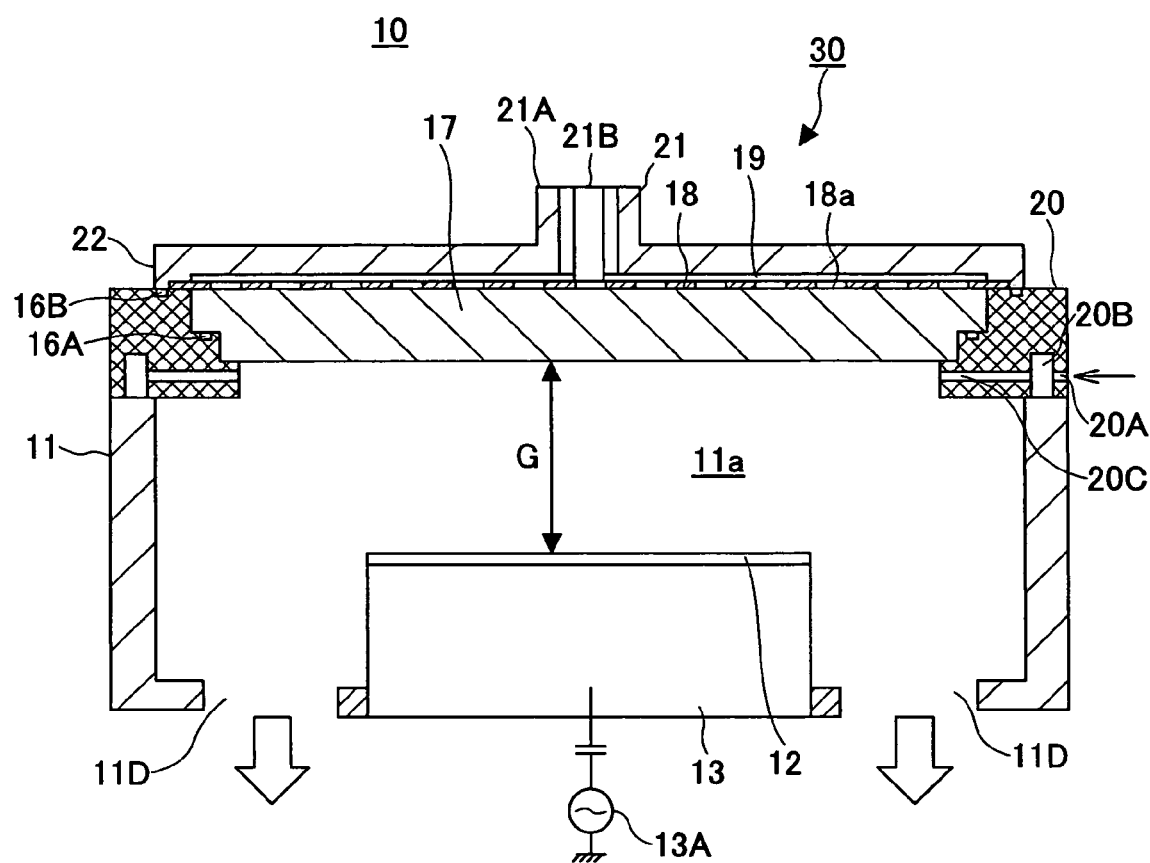
FIG. 8 is a cross-sectional view showing the processing vessel used for the plasma processing schematically.
Figure 8:
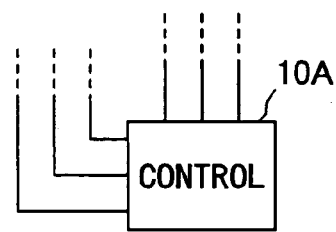

FIG. 8 is a diagram showing an example of the processing vessel 10 used for carrying out the post-processing (plasma processing) of the insulation film schematically.

Referring to FIG. 8, the processing vessel 10 includes a chamber 11 forming a space 11a therein and a stage 13 provided in the chamber 11 for hold a substrate to be processed 12 by way of an electrostatic chuck.

Thereby, it should be noted that the space 11a inside the chamber 11 is decompressed and evacuated by evacuation means such as a vacuum pump via at least two, preferably three evacuation ports 11D formed at a bottom part of the chamber 11 generally in axial symmetry with respect to the substrate 12 to be processed on the stage 13 with a constant interval so as to surround the stage 13.

For the part of the outer wall of the chamber 11 corresponding to the substrate 12 to be processed 12, there is disposed a microwave transmission window 17 of a dielectric material transparent to microwave such as quartz so as to face the substrate 12 to be processed, wherein there is inserted a plasma gas introduction ring 20 introducing a plasma gas into the processing vessel 11 between the microwave transmission window 17 and the processing vessel 11. Thereby, the microwave window 17 and the plasma gas introduction ring 20 constitute an outer wall of the chamber 11.

It should be noted that the microwave transmission window 17 has a stepped part in a rim part thereof, wherein the stepped part engages with a corresponding stepped part provided on the plasma gas introduction ring 20. Further, there is provided a seal ring 16A for hermetically sealing the processing space 11a.

The plasma gas introduction ring 20 is supplied with a plasma gas from a plasma gas inlet port 20A, wherein the plasma gas thus introduced spreads through a gas groove 20B formed in generally annular form. The plasma gas in the gas groove 20B is then introduced into the space 11a via plural plasma gas holes 20C that communicate with the gas groove 20B.

On the microwave transmission window 17, there is provided a plasma generation part 30, wherein the plasma generation part 30 includes a planar antenna plate 18 of a stainless steel alloy or aluminum alloy applied with gold plating or silver plating and disposed close to the microwave transmission window 17, the planar antenna plate being with plural slots 18a and 18b, a shielding case 22 of a conductor material shielding the microwave and holding the antenna plate 18, and a retardation plate 19 consists of a low loss dielectric material such as $Al_2O_3$, $SiO_2$ or $Si_3N_4$ sandwiched between the antenna plate 18 and the shielding case 22. Further, hermetic sealing is established by a seal ring 16B such as an O ring in the part where the plasma generation part 30 and the microwave transmission window 17 engage with each other.

It should be noted that the plasma generation part 30 is mounted upon the chamber 11 via the plasma gas introduction ring 14, and a microwave of 2.45 GHz is supplied from an external microwave resource via a coaxial waveguide 21 connected to a central part of the plasma generation part 30.

The microwave thus supplied is radiated to the chamber 11 from the slots on the antenna plate 18 via the microwave transmission window 17 and is introduced into the space 11a right underneath the microwave transmission window 17. Thereby, plasma excitation is caused in the plasma gas supplied from the plasma gas supply ring 20 such as Ar and hydrogen. Because the plasma thus excited has a low electron temperature, the damage to the substrate to be processed is minimized. Further, the plasma thus excited forms high density plasma ($10^{11}$-$10^{13}$/cm$^3$) A waveguide 21A forming an outside part of the coaxial waveguide 21 is connected in the shielding case 22, while a central conductor 21B is connected at the center of the antenna plate 18 via an opening formed in the retardation plate 19. Thereby, the microwave supplied to the coaxial waveguide 21A is radiated from the slots as it is propagated in the radial direction between the shielding case 22 and antenna plate 18.

Further, there may be provided a cooling part on the shielding case 22 for cooling the microwave transmission window 17, the antenna plate 18 and the retardation plate 19.

Figure 9:
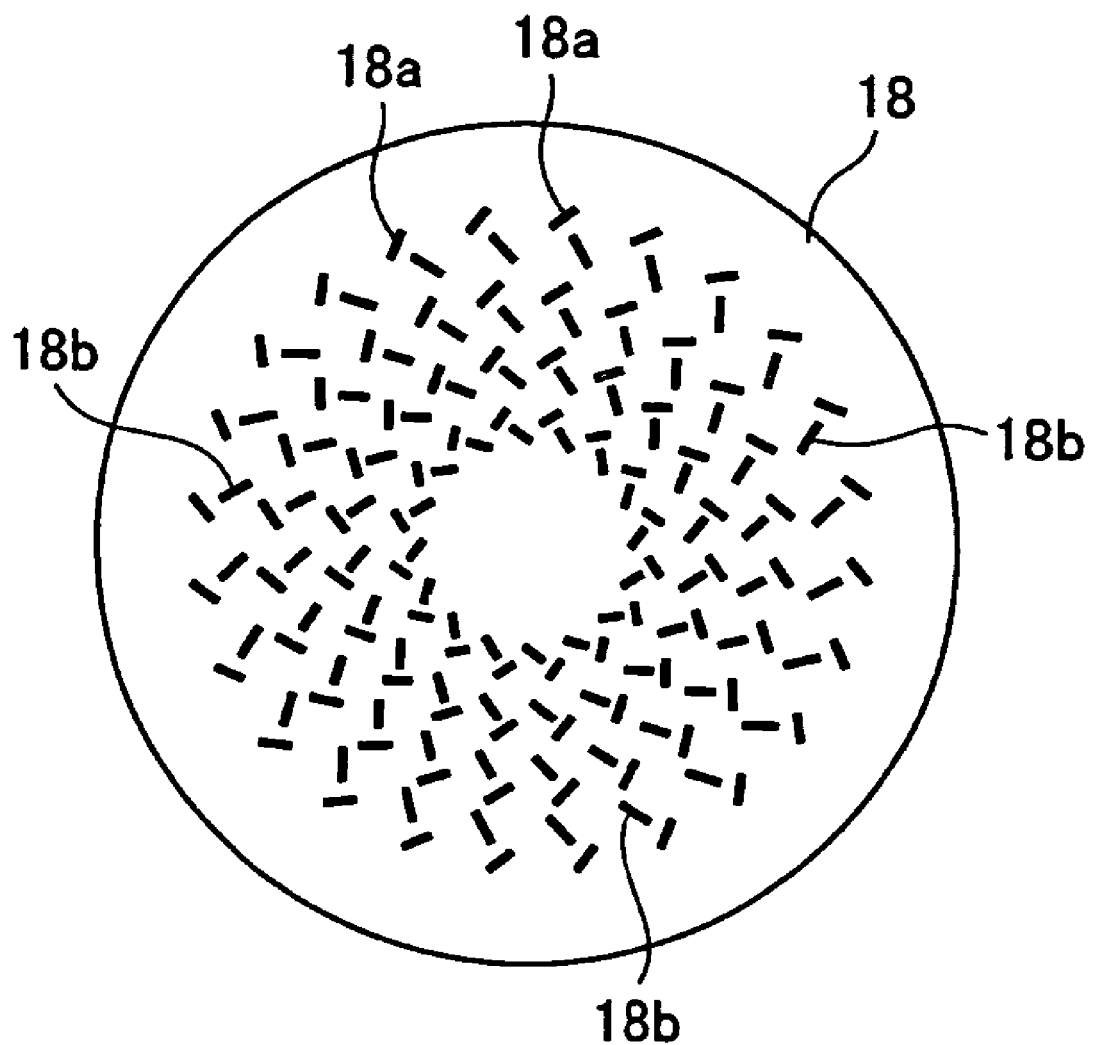
FIG. 9 is a plan view diagram showing an antenna plate used with the processing vessel of FIG. 8.

FIG. 9 shows the antenna plate 18 in a plan view.

Referring to FIG. 9, the antenna plate 18 is provided with a large number of mutually perpendicular slots 18a and 18b from which the microwave radiation is achieved. The plasma generation part 30 that uses the antenna plate 18 is called a radial line slot antenna.

With the plasma generation part 30 of such a construction, the microwave supplied from the coaxial waveguide 21 spreads in the radial direction as it is propagated between the shielding case 22 and the antenna plate 18, wherein the microwave experiences compression of wavelength by the retardation plate 19.

Thus, by forming the slots 18a and the slots 18b intersecting perpendicularly with each other in a concentric relationship in correspondence to the wavelength of the microwave, it becomes possible to radiate the microwave in the form of a plane wave of circular polarization.

By using such a plasma generation part 30, it is possible to excite high density plasma in the processing space 11a uniformly. The high-density plasma thus formed has a low electron temperature of 0.7-2 eV, for example, and thus, there is caused little damaging in the substrate 12 to be processed. Further, the chance of metal contamination caused by the sputtering of the chamber wall of the processing vessel 11 is minimized.

The operation regarding the film formation processing of the processing vessel 10 is controlled, by the control means 10A, which may include a computer (CPU) and a storage medium. Thus, the operation such as supply and discharge of gas, control of microwave plasma, or the like, is controlled by the control means 10A. Thereby, the control means 10A is controlled by a program stored in the storage medium.

In the case of applying the post-processing (plasma processing) to the insulation film formed on the substrate by using the processing vessel 10, for example, the program stored in the storage medium (called also recipe) controls the control means 10A such that the processing vessel 10 applies the plasma processing to the insulation film formed on the substrate to be processed according to the flowchart shown in FIG. 5 similarly to the case of the processing chamber 300 of the first embodiment, as the post-processing.

For example, the plasma processing can be conducted by setting the temperature of the substrate to be processed to 400° C. and the pressure of the processing space 11a to 260 Pa, and by supplying the microwave electric power of 2.45 GHz frequency with the electric power of 2000 W, together with an Ar gas and a hydrogen gas as the second processing gas for 5 minutes with respective flow rates of 250 sccm and 500 sccm.

As a result of the plasma processing conducted under the foregoing condition, an insulation film having the specific dielectric constant of 2.44 was obtained with the film thickness of 220 nm, wherein it was confirmed that the insulation film thus formed has the longitudinal modulus of elasticity of 16.0 GPa. Further, in the case the insulation film was formed with the specific dielectric constant of 2.33 and the film thickness of 375 nm, it was confirmed that the longitudinal modulus of elasticity of the insulation films is 10.7 GPa.

Thus, in any of these cases, the insulation film shows a high elastic modulus value of 10 GPa or more, indicating that the film has an increased hardness and increased mechanical strength as compared with the case of the first embodiment in which film the plasma processing is conducted by a parallel plate plasma processing apparatus.

It should be noted that such an insulation film of large mechanical strength and large elastic constant is suitable for the interlayer insulation film of multilayer interconnection structure in view of high reliability against stress such as the one applied at the time of CMP (chemical mechanical polishing) process. Thus, with the use of the insulation film of the present invention, it is possible to increase the reliability of multilayer interconnection structure.

In order to obtain such low-K insulation film of large elastic modulus and high reliability as noted above, there exists a range of process condition for the plasma processing used for the post-processing of the insulation film as will be explained below.

Figure 10A:
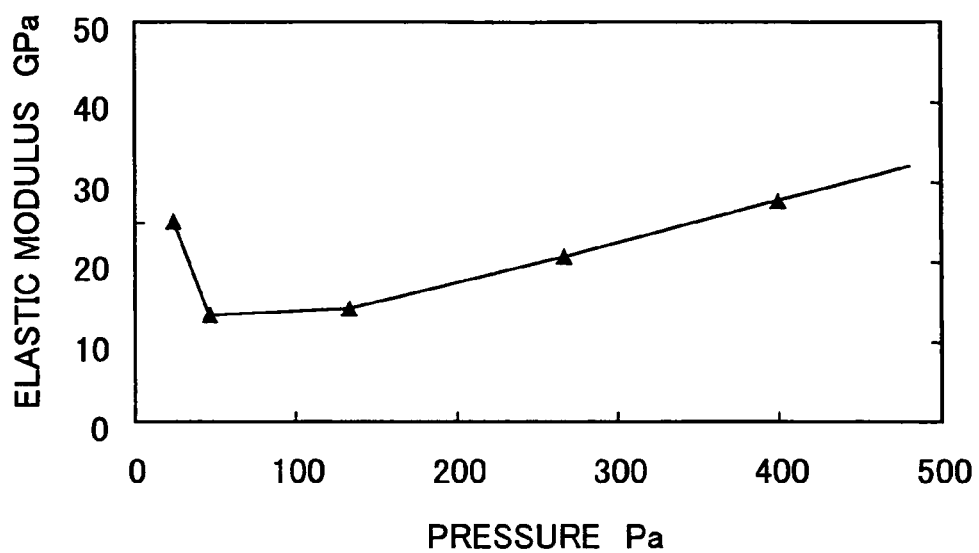
FIG. 10A is a diagram showing a change of elastic modulus of the insulation film for the case of changing the pressure in the processing vessel.
Figure 10B:
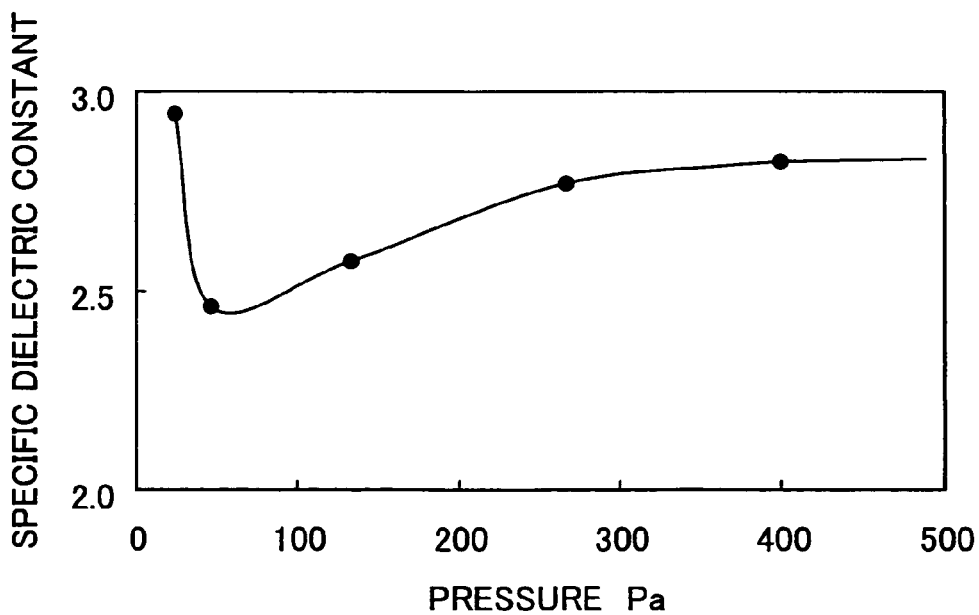
FIG. 10B is a diagram showing the change of specific dielectric constant of the insulation film for the case of changing the pressure of the processing vessel.

FIG. 10A shows the change of the longitudinal elastic modulus of the insulation film for the case the pressure of the processing space 11a is changed variously at the time of the plasma processing of the insulation film, while FIG. 10B shows the change of the specific dielectric constant of the insulation film for the case in which the pressure of the processing space 11a at the time of the plasma processing of the insulation film is changed.

Referring to FIG. 10A, it can be seen that there occurs some change of the elastic modulus for the insulation film with the change of the pressure of the processing space 11a at the time of the plasma processing, while the elastic modulus of the insulation film maintains the value of 10 GPa or more, and thus, the hardness of the insulation film is maintained even when the pressure is changed to some extent.

However, when the pressure inside the processing vessel becomes below 10 Pa, there is caused an increase in the proportion of ions in the active species excited in the processing vessel, and the effect of sputtering by the ions is increased, leading to increased degree of etching of the insulation film. Further, in the case the pressure inside the processing vessel has exceeded 1000 Pa, there arises a concern that there may be increased degree of film shrinkage. Therefore, it is preferable to set the pressure inside the processing vessel at the time of the plasma processing to be 10 Pa or more but not exceeding 1000 Pa.

Further, with reference to FIG. 10B, it can be seen that the specific dielectric constant of the insulation film is changed in correspondence to the change of the pressure inside the processing vessel at the time of the plasma processing.

More specifically, it can be seen that the specific dielectric constant decreases with increase of the pressure of the processing space 11a in the pressure range of about 50 Pa or less, while in the pressure region exceeding about 50 Pa, there exists a tendency that the specific dielectric constant increases with increase of the pressure.

From this, it is understood that there exists a desirable pressure region for achieving a specific dielectric constant value for the insulation film.

For example, it is preferable to set the pressure of the processing space 11a at the time of the plasma processing to be 10 Pa or more but not exceeding 500 Pa in order to achieve the specific dielectric constant of 3 or less, while in the case of achieving the specific dielectric constant of 2.5 or less, it is preferable to set the pressure of the processing space 11a at the time of the plasma processing to 40 Pa or more but not exceeding 90 Pa.

Further, it is preferable to set the microwave electric power applied to the plasma generation part 30 for plasma excitation at the time of the plasma processing to be 500 W or more but not exceeding 2000 W. When the microwave electric power is less than 500 W, it should be noted that dissociation of the second processing gas does not proceed satisfactorily and the effect of the plasma processing becomes insufficient. On the other hand, when the microwave electric power is set to be larger than 2000 W, there can be a case that the insulation film processed with the plasma is damaged.

Figure 11:
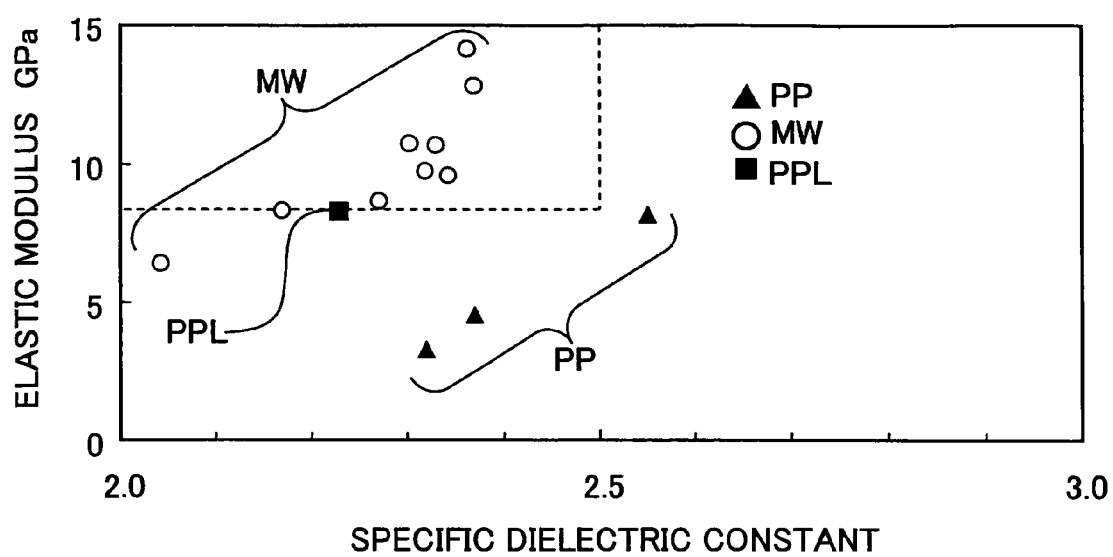
FIG. 11 is a diagram showing the relationship between the specific dielectric constant and elastic modulus of the insulation film after the plasma processing.

FIG. 11 is a diagram showing the relationship between the specific dielectric constant and the longitudinal elastic modulus of the insulation film formed by the substrate processing method according to the first embodiment and the second embodiment.

Referring to FIG. 11, an experiment PP represents the result of the plasma processing conducted according to the first embodiment, in other words, the case of conducting the plasma processing of the insulation film in the processing chamber 300 of the parallel plate plasma processing apparatus, while an experiment MW represents the result of the plasma processing conducted according to the second embodiment, in other words, the case of conducting the plasma processing of the insulation film in the processing vessel 10 of the microwave plasma processing apparatus.

In the case of the experiment PP, the plasma processing has been conducted under the condition in which the high frequency electric power is set to 500-2000 W and the pressure inside the processing vessel is set to 30-100 Pa. On the other hand, in the case of the experiment MW, the plasma processing was conducted under the condition in which the microwave electric power is set to 500-2000 W and the pressure inside the processing vessel is set to 50-266 Pa.

Referring to FIG. 11, it can be seen that a high elastic modulus is attained in the case of the experiment MW that uses the processing vessel 10 for the microwave plasma processing as compared with the case of conducting the plasma processing by using the parallel-plate apparatus. Thus, the insulation film formed with the experiment MW has excellent hardness and mechanical strength and is thought suitable for use as an interlayer insulation film.

It is believed that the foregoing results have been obtained as a result of the use of the plasma generation part 30 that excites the microwave plasma of low electron temperature and high density. For example, an insulation film of the dielectric constant of 2.5 or less and the elastic modulus of 10 GPa or more is achievable with the present invention.

Further, FIG. 11 shows the result of an experiment PPL, in which the processing time of the experiment PP is increased by five times. The point PPL indicates that it would require a long processing time when attempt is made to form a hard insulation film of high elastic modulus by using such a parallel plate plasma processing apparatus.

By using the microwave plasma with the processing vessel 10 as in the case of the experiment MW, on the other hand, it is possible to form an insulation film of high elastic modulus and large mechanical strength with a time of about ⅕ the time needed when using a parallel-plate plasma processing apparatus. It is concluded that the use of microwave plasma processing is more effective for obtaining an insulation film of the specific dialectic constant of 2.5 or less and the elastic modulus of 8 GPa.

It should be noted that the specific dielectric constant and the mechanical strength of the insulation film also changes when the gap G shown in FIG. 8 representing the distance between the microwave transmission window 17 and the substrate 12 to be processed in the processing vessel 10.

Figure 12:
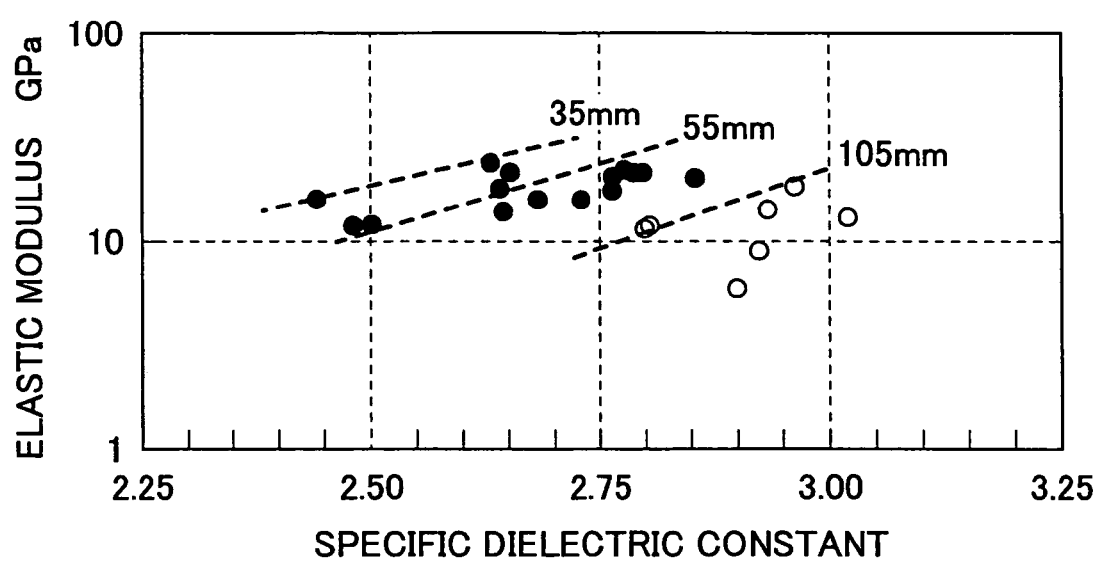
FIG. 12 is a diagram showing the relationship between the specific dielectric constant and elastic modulus of the insulation film for the case of changing the distance between the microwave transmission window and substrate to be processed.

FIG. 12 is a diagram showing the relationship between the specific dielectric constant and the longitudinal elastic modulus of the insulation film after the plasma processing while changing the gap G of the processing vessel 10 variously. More specifically, FIG. 12 shows the result for the cases in which the gap G is set to 35 mm, 55 mm and 105 mm.

Referring to FIG. 12, it can be seen that there is a tendency that the specific dielectric constant of the insulation film becomes low and the elastic modulus becomes large by setting the gap G to 55 mm as compared with the case of setting the gap G to 105 mm. Similarly, it can be seen that there is a tendency that the specific dielectric constant of the insulation film becomes low and the elastic modulus becomes large by setting the gap G to 35 mm as compared with the case of setting the gap G to 55 mm.

Thus, it is preferable to narrow the gap G in order to form an insulation film of low specific dielectric constant and excellent mechanical strength. Thus, in order to form an insulation film of the specific dielectric constant of 2.5 or less and the elastic modulus of 8 GPa or more, it is preferably to set the gap G to be 55 mm or less.

On the other hand, when the gap G is excessively narrowed, it becomes difficult to control the temperature rise of the substrate to be processed, and there arises a concern that the substrate to be processed may be damaged. Thus, it is preferable to set the gap G to be 10 mm or more.

Third Embodiment

Meanwhile, in the case the insulation film is formed by the processing chamber 200 shown in FIG. 3, there can be a case in which it is difficult to remove the insulation film containing Si and C and adhered to the chamber wall 201, the showerhead 201B, the stage 201A, and the like, inside the processing vessel 201, by way of cleaning process.

In the case of a silicon oxide film ($SiO_2$ film) used conventionally, etching of the silicon oxide film is achieved easily by ions or radicals formed by exciting a gas containing fluorine such as a CF family gas or a $NF_3$ gas by plasma.

In the case the insulation film contains Si and C as in the case of an SiC film, an SiCO film or SiCO(H) film, there occurs extreme decrease of etching rate when the ions or radicals formed by the CF family gas or $NF_3$ gas are used, leading to the problem of prolonged cleaning time. Further, such prolonged cleaning time raises the problem in that the processing vessel, in which the cleaning is conducted, may be damaged.

For example, while it is possible to increase the etching rate by using a gas such as an HF gas, it was inevitable that the interior of the processing vessel undergoes a damage to some extent with the use of HF in view of the fact that the processing vessel is usually formed of a metal such as Al or Al alloy.

Accordingly, the present embodiment provides a cleaning method of the processing vessel wherein the foregoing problems are eliminated.

When conducting the cleaning method of the present embodiment, the processing chamber 200 shown in FIG. 3 is modified as noted below.

Figure 13:
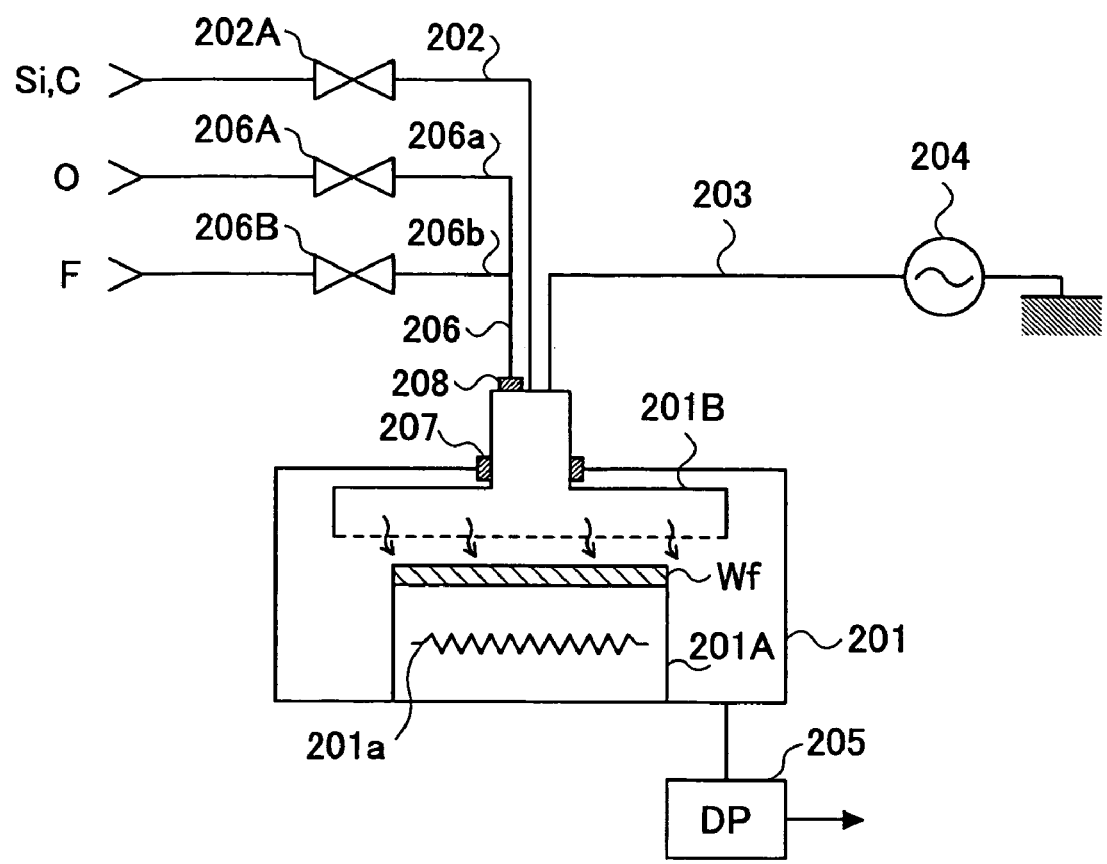
FIG. 13 is a diagram schematically showing an example of possible substrate processing apparatus capable of conducting the substrate processing method according to a third embodiment of the present invention.

FIG. 13 is a diagram schematically showing the construction of a processing apparatus 200A to which the cleaning method and substrate processing method of the present embodiment is applied, wherein those parts in the drawing corresponding to the parts explained previously are designated by the same reference numerals and the description thereof will be omitted.

Referring to the drawing, the shower head 201B is connected with the gas line 202 used for supplying an organic silane gas containing Si and C such as trimethyl silane ($SiH(CH_3)_3$) as the source gas of film formation of the insulation film similarly as before, wherein, with the processing apparatus 200A of the present embodiment, a gas line for supplying a cleaning gas is connected to the showerhead 201B for the purpose of cleaning the interior of the processing vessel 201. Thereby, it should be noted that the gas line 206 is connected with a gas line 206a having a valve 206A for supplying a cleaning gas as a third processing gas and a gas line 206b having a valve 206B for supplying another cleaning gas as a fourth processing gas.

The gas line 206a is connected to a gas source not illustrated and a gas containing oxygen such as an oxygen gas is supplied from the gas line 206a to the interior of the processing vessel 201 via the showerhead 201B as the third processing gas for cleaning.

Similarly, the gas line 206b is connected to a gas source not illustrated and a gas containing fluorine such as a $NF_3$ gas is supplied from the gas line 206b to the interior of the processing vessel 201 via the showerhead 201B as the fourth processing gas for cleaning. Further, the gas lines 203a and 203b are used for supplying an inert dilution gas according to the needs.

The substrate processing method of forming an insulation film on the substrate Wf to be processed in the processing apparatus 200A and further performing the cleaning process of the processing vessel will be conducted according to the flowchart of FIG. 14 as follows.

Figure 14:
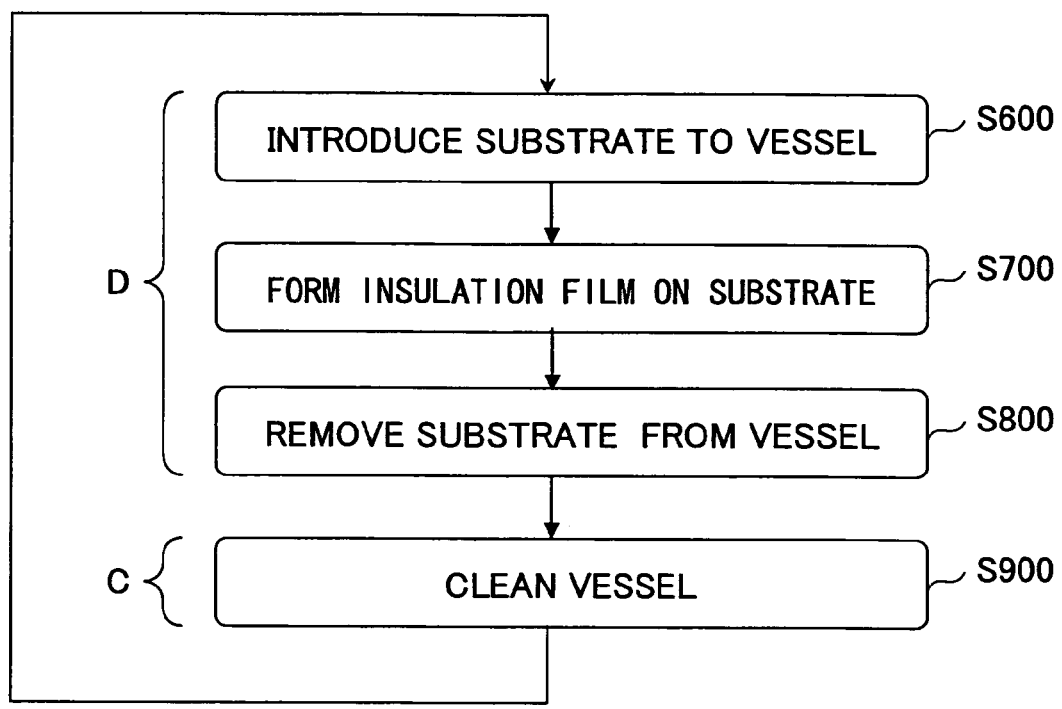
FIG. 14 is a flowchart showing the substrate processing method according to the third embodiment.

Referring to FIG. 14, a gate valve provided to the processing apparatus 200A is opened in a step 600 (designated in the drawing as S600; similar designation will be used throughout) and the substrate to be processed is introduced into the processing vessel 201, wherein the substrate thus introduced is placed on the stage 201A.

Next, in a step 700, formation of the insulation film is conducted on the substrate according to the process explained with reference to the first embodiment.

There, an insulation film containing Si and C, such as an SiCO(H) film, is formed on the substrate to be processed as a result of plasma decomposition of the gas and associated deposition.

Next, in a step 800, the substrate is taken out from the processing vessel 201 in the step 800. By repeating the film formation process D from the step 600 to the step 800 for plural times, there can be formed insulation films on plural substrates in succession.

On the other hand, in the film formation process D, there occurs deposition of the insulation film also in the interior of the processing vessel 201 including the shower head 201B and the stage 201A provided therein, and thus, there arises a need of conducting a cleaning process of the processing vessel 201.

Thus, in the substrate processing of the present embodiment, a cleaning process C is conducted in the step 900 for cleaning the interior of the processing vessel 201.

Thereby, the foregoing cleaning process may be conducted each time a substrate is processed for forming the insulation film thereon, or alternatively after processing of every 25 substrates. In the latter case, the insulation films corresponding to the 25 substrates are cleaned at the same time.

Conventionally, there has been a case in which the cleaning process becomes difficult when a cleaning process used conventionally for film formation of a silicon oxide film is applied to the case of film formation of the insulation film containing Si and C because of small etching rate.

Thus, with the present embodiment, a plasma processing is applied with the third processing gas containing oxygen for facilitating oxidation of the insulation film and then conduct a plasma processing with the fourth processing gas containing fluorine for removing the highly oxidized insulation film by etching.

With this, there is caused increase of the etching rate for the insulation film containing Si and C, and it becomes possible to reduce the time needed for the cleaning process. With this, it becomes possible to conduct the cleaning process without damaging the processing vessel.

Figure 15:
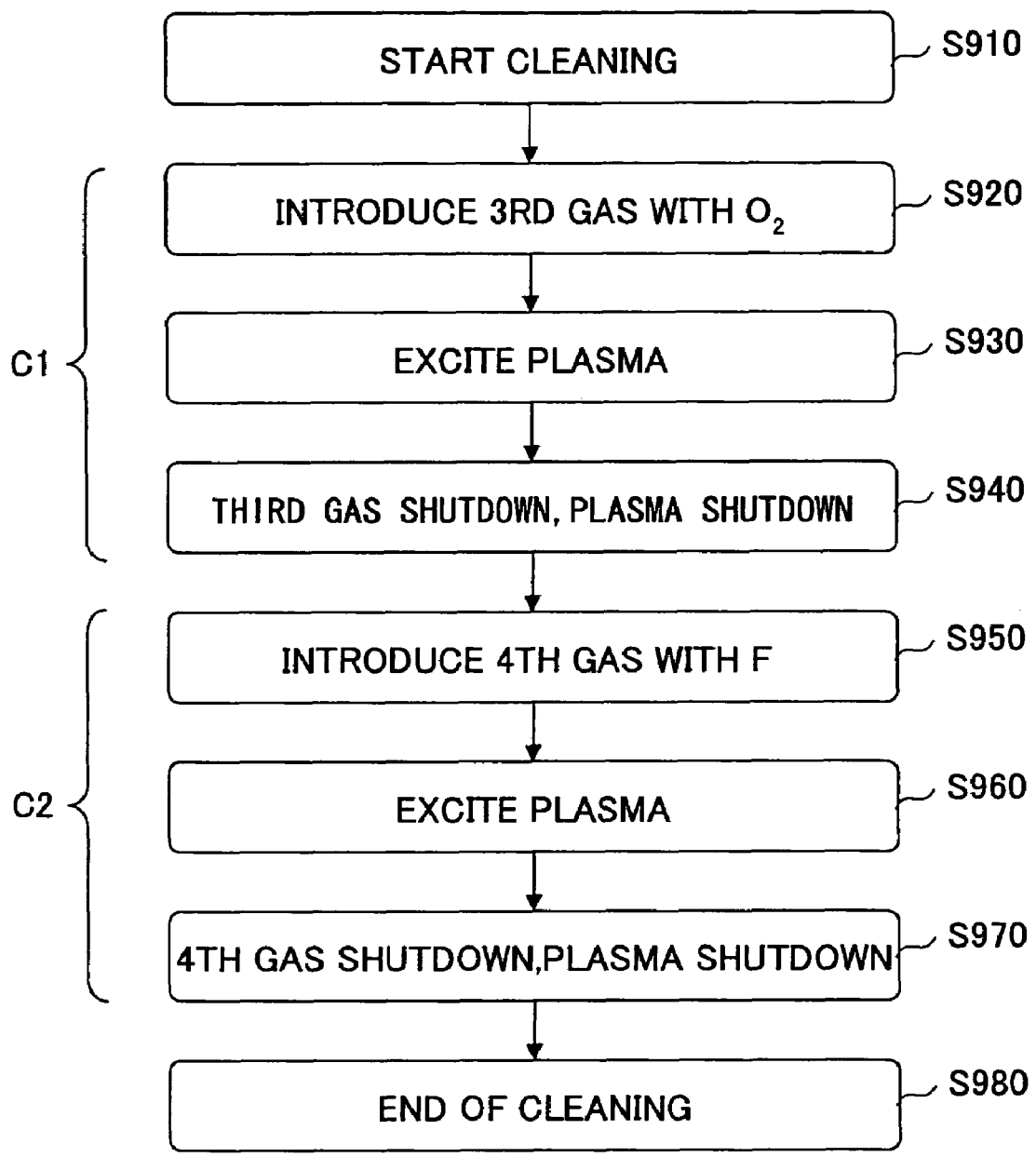
FIGS. 15-18 are flowcharts showing the details of the cleaning processing of the substrate processing method shown in FIG. 14.

Next, the details of the step 900 will be explained with reference to FIG. 15 showing the cleaning process of the present embodiment.

FIG. 15 is a flowchart showing the details of the cleaning method according to the present embodiment.

Referring to FIG. 15, the cleaning process is started with a step 910, and a step 920 is conducted thereafter, wherein the third processing gas such as an oxygen gas is introduced into the processing vessel 201 via the showerhead 201 by opening the valve 206A with a flow rate of 200 sccm. The pressure inside the processing vessel 201 is set to 60 Pa.

Next, in a step 930, a high frequency power of 1000 W is applied to the shower head 201B from the high frequency source 204, and with this, high frequency plasma is excited in the chamber 201. Thereby, oxidation is promoted for the insulation film containing Si and C and deposited on the interior of the processing vessel 201 including the showerhead 201B and the stage 201A by using the oxygen radicals and the oxygen ions in the oxygen plasma.

In this process, the temperature of the processing vessel 201 is maintained at 50-200° C., preferably 100-150° C. by a wall heater provided to the processing vessel 201 not shown in FIG. 13 for the purpose of increasing the etching rate of the insulation film. During this process, it is preferable to set the temperature of the stage to 100-450° C. In the illustrated example, the temperature is set to 350° C.

Next, in a step 940, the valve 206A is closed and the feeding of the high frequency power is terminated. With this, the plasma is turned off.

Next, in a step 950, the valve 206B is opened and the fourth processing gas containing fluorine such as the $NF_3$ gas is introduced into the procession vessel 201 via the shower head 201B with a flow rate of 150 sccm. Thereby, the pressure inside the processing vessel 201 is set to 60 Pa.

Next, in the step 960, a high frequency power of 1500 W is fed from the high frequency power source 204 to the showerhead 201B and high frequency plasma is formed inside the processing vessel 201. With this, the insulation film deposited inside the processing vessel 201 including the showerhead 201B and the stage 201A is etched away by the fluorine radicals and fluorine ions in the $NF_3$ plasma. Thereby, it should be noted that, because the oxidation of the insulation film containing Si and C is promoted in the previous step 930, the insulation film is easily etched away by the fluorine radicals and fluorine ions in the form of $SiF_x$.

In this process, the temperature of the processing vessel 201 is maintained to 50-200° C., preferably 100-150° C. by the wall heater provided to the processing vessel 201 but not illustrated in FIG. 13 for the purpose of increasing the etching rate of the insulation film. During this process, it is preferable to set the temperature of the stage to 100-450° C. In the illustrated example, the temperature is set to 350° C.

Next, in a step 970, the valve 206B is closed and the feeding of the high frequency power is terminated. Thereby the plasma is turned off, and the cleaning process is completed in a step 980.

Thus, with the present embodiment, the oxygen processing step C1 corresponding to the steps 920-940 of FIG. 15 is conducted for promoting the oxidation of the insulation film containing Si and C by using the plasma of the third processing gas containing oxygen such as the oxygen plasma. Thereby, there is a possibility that a part of C is removed in the form of $CO_2$.

Thus, in the steps 950-970 of FIG. 15, the etching is applied to the insulation film in which the oxidation process has been promoted and a part of C (carbon) is removed, by using the plasma of the fourth processing gas containing fluorine such as the $NF_3$ plasma, and thus, the etching rate is improved substantially as compared with the conventional art process.

A comparison was made for the cleaning time between the case of using the method of the present embodiment shown in FIGS. 14 and 15 and the case of using a conventional method, and it was confirmed that the cleaning time is reduced with the present embodiment.

More specifically, the present embodiment was compared for the cleaning time with the conventional case in which the oxygen processing step C1 is omitted. In both of these cases, the insulation film containing Si and C was formed in the film formation step D of FIG. 14 by repeating the step of forming the insulation film with the thickness of 50 nm for 25 times.

With this experiment, it was confirmed that the insulation film is not removed completely with the conventional process even when the processing of the step 960 is conducted for the duration 45 minutes, and thus, it was confirmed that a process time of 45 minutes or more is needed for achieving the desired cleaning with the conventional process.

In the case of the present embodiment, on the other hand, it was confirmed that the insulation film containing Si and C and deposited inside the processing vessel 201 such as the inner surface of the vessel 201, the stage 201A and the showerhead 201B, can be removed completely by conducting the step 930 for ten minutes, the step 950 for 15 minutes, and thus, the plasma process in total of 25 minutes.

Because of the reduced cleaning time, the duration in which the processing vessel is exposed to the plasma is reduced, and thus, the damage caused in the processing vessel 201 by the plasma can be reduced. Thereby, metal contamination or formation of particles associated with the plasma damage is successfully suppressed. Further, because of the reduced plasma damage, the maintenance cycle of the apparatus can be increased and the cost of the expensive cleaning gas is also reduced as a result of decrease of the cleaning time. Thereby, the running cost of the apparatus can be reduced.

Further, with the present embodiment, which uses the so-called parallel-plate plasma processing construction in which the plasma is excited between the showerhead 201B and the stage 201A, it becomes possible to reduce the consumption of the cleaning gas used for the cleaning process as compared with the case of the so-called remote plasma construction in which the plasma is generated by a separate plasma generator and the radicals formed with the plasma are introduced into the processing vessel for the cleaning process. Thereby, the running cost of the apparatus is reduced.

Further, the present embodiment uses the same plasma source for the film formation and the cleaning, and thus, the construction of the substrate processing apparatus is simplified. Thereby, the cost of the substrate processing apparatus can be reduced.

Further, as compared with a high-density plasma source such as an ICP (induction-coupled plasma) source, the parallel-plate plasma apparatus has an advantageous feature of simple construction and low apparatus cost.

While the present embodiment has been explained for the case of using oxygen for the third processing gas, it is also possible to dilute the third processing gas by an inert gas such as Ar, He, or the like, according to the needs. Further, it is possible to use a compound gas containing O such as $N_2O$ in place of the oxygen gas. Further, the same effect as the present embodiment is attained also by using an ozone gas.

With regard to the fourth processing gas, it is possible to use other etching gas containing F in addition to $NF_3$, such as a fluorocarbon gas including a $CF_4$ gas, a $C_2F_6$ gas, a $C_5F_8$ gas, and the like. Further, a similar effect is attained also by using an $SF_6$ gas.

Further, while the present embodiment has been explained for the case of using trimethyl silane for the organic silane gas at the time of the film formation process as the film formation gas, while it is also possible to use other organic silane gas for the film formation of the insulation film. for example, it is possible to use a dimethyl dimethoxy silane gas (DMDMOS) for this purpose.

Further, it is possible to use the silane ($SiH_4$) gas admixed with another gas for the source gas of the film formation processing. For example, it is possible to form an SiC film, an SiCO film, an SiCO(H) film, and the like, by using a silane gas admixed with an oxygen gas and a hydrocarbon gas such as a methane gas, an ethane gas, and the like, as the source gas of the film formation processing. Similarly, it is possible to form an SiC film, an SiCO film, an SiCO(H) film, or the like, by adding methanol, ethanol, and the like, to the silane gas. Further, it is also possible to form a film containing nitrogen such as a SiCN film.

It should be noted that the insulation film containing Si and C formed with the present embodiment can be used in the fabrication process of a semiconductor device having a multilayer interconnection structure as a low-K hard mask film at the time of etching an interlayer insulation film. It should be noted that the low-K film of the present invention does not cause the problem of increase of the parasitic capacitance between the interconnection layers and can be used successfully for the hard mask.

Further, the insulation film containing Si and C of the present invention can be used for the low-K interlayer insulation film of the semiconductor device. With the use of such a low-K insulation film of the present invention, the parasitic capacitance between the interconnection patterns can be reduced effectively.

When using the insulation film of the present invention, it is preferable to increase the amount of oxygen or hydrogen added to the film as compared with the case of using the insulation film as a hard mask, such that the film has a composition of SiCO or SiCO(H). Thereby, the specific dielectric constant can be reduced further.

Thus, the cleaning technology of the present embodiment is effective and useful for cleaning the processing vessel at the time of formation of the insulation film of low dielectric constant suitable for the low-K hard mask film or low-K interlayer insulation film used for the multilayer interconnection structure of high-speed semiconductor devices.

Fourth Embodiment

The foregoing third embodiment of the present invention can be modified as noted below, with substantially the same effect.

Figure 16:
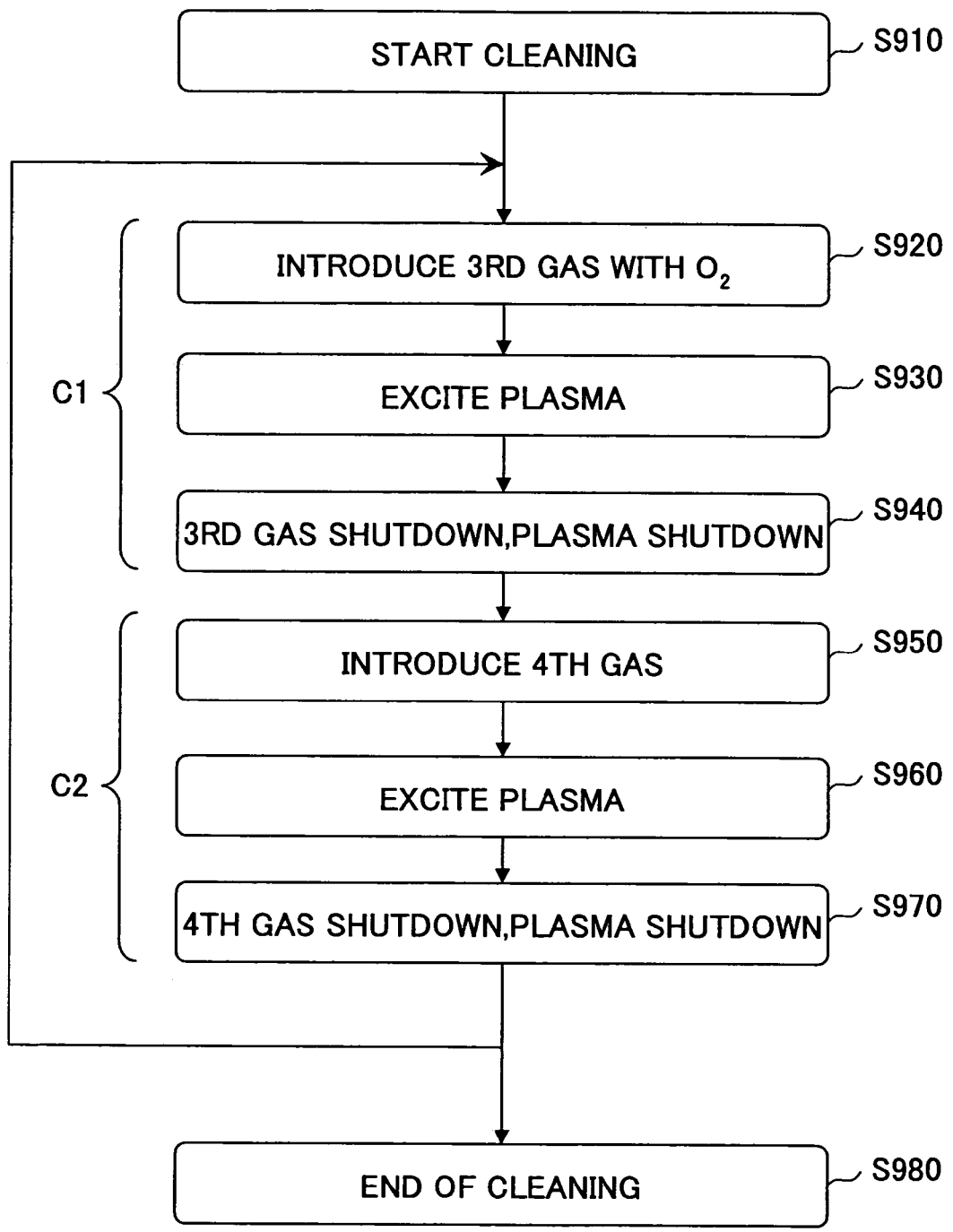

FIG. 16 is a flowchart showing a the cleaning process according to a fourth embodiment of the present invention, wherein the cleaning process of FIG. 16 is a modification of the cleaning process of FIG. 15. In the drawing, those parts corresponding to the parts explained previously are designated by the same reference numerals and the description thereof will be omitted.

In the present embodiment, the process is controlled to return to the step 920 after the completion of the step 970, and thus, the steps from the step 920 to the step 970 corresponding to the oxygen processing step C1 and the processing step C2 for processing by the fluorine-containing gas are repeated. After repetition of the process steps from the step 920 to the step 970 for a predetermined time, the process is terminated at the step 980.

Thus, with the present embodiment, oxidation of the insulation film or removal of C from the insulation film is conducted efficiently in addition to the effect of the third embodiment explained previously, and it becomes possible to increase the etching rate of the insulation film further.

For example, in the case the insulation film to be etched has a large thickness, the oxidation processing may not penetrate to the interior of the insulation film sufficiently with the process C1 from the step 920 to the step 940 and the effect of removing the carbon inside the insulation film may not be sufficient. In such a case, there is a concern that the etching rate of the insulation film may decrease in the steps from the step 950 to the step 970 corresponding to the process C2 with the progress of etching of the invention film.

With the present embodiment, on the other hand, the oxygen processing step C1 and the processing step C2 conducted by the fluorine-containing gas are repeatedly implemented, and thus, there is conducted the oxygen processing step C1 after the etching of the insulate film. Thereby, the oxidation of the insulation film and the removal of C from the insulation film are ensured even when the etching process has been progressed with the insulation film. Thus, decrease of the etching rate can be prevented even when the etching of the insulation film has proceeded, and high etching rate is maintained until all the insulation film is etched out.

Further, because the present embodiment is particularly effective in the case the insulation film to be etched has a large thickness, the present embodiment is particularly effective when conducting the cleaning for the insulation film corresponding to plural substrates such as 25 substrates after processing the film formation process D of FIG. 14 for plural times corresponding to the 25 substrates.

In view of the transportation time of the substrates to be processed, the cleaning processing can be conducted more efficiently by processing plural substrates at once after film formation on such plural substrates than processing the substrates one by one each time film formation is made on a substrate. Thus, the present embodiment is a technology suitable for improving the efficiency of substrate processing.

Fifth Embodiment

Figure 17:
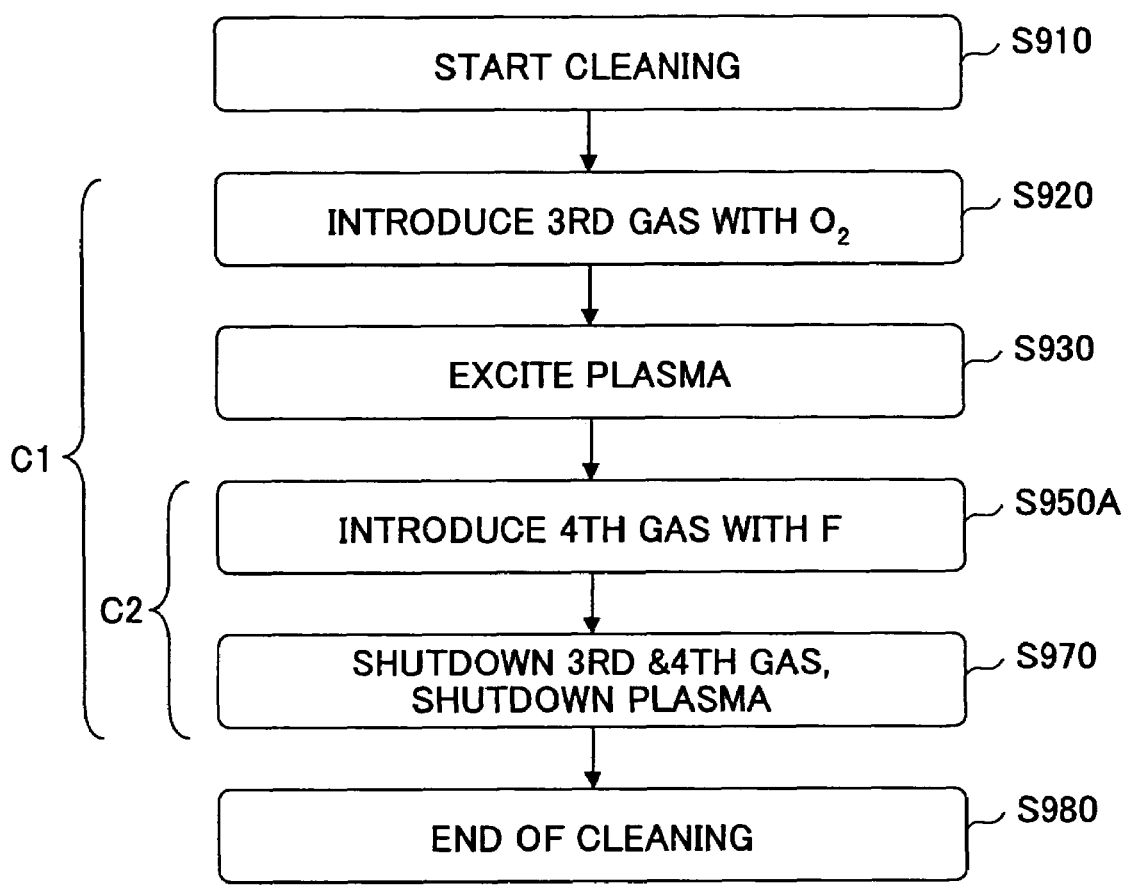

Next, a fifth embodiment of the present invention will be described with reference to FIG. 17, wherein the present embodiment is another modification of the cleaning process according to the third embodiment of the present invention. In FIG. 17, those parts corresponding to the parts explained previously are designated by the same reference numerals and the description thereof will be omitted.

Referring to FIG. 17, there is conducted a step 950A after the step 930 with the present embodiment to open the valve 206B and introduce the fourth processing gas such as the $NF_3$ gas into the processing vessel 201 via the shower head 201B with a flow rate of 150 sccm.

In the step 970, the valves 206A and 206B are closed and the feeding of the high frequency power is terminated. Further, the processing is terminated with the step 980.

In the present invention, it should be noted that the fourth processing gas is introduced in the state that there is formed plasma of the third processing gas. Thus, in addition to the foregoing effect of the third embodiment, the present embodiment can provide the advantageous effect of simple control process for the cleaning processing. Thereby the time needed for the cleaning processing is reduced.

In the present embodiment, it should be noted that the etching of the insulation film by fluorine proceeds simultaneously to the oxidation of the insulation film and removal of C. Thereby, it is possible to reduce the amount of the third processing gas introduced in the step 950 according to the needs. Alternatively, it is possible to interrupt the introduction of the third processing gas in the step 950A.

Sixth Embodiment

Figure 18:
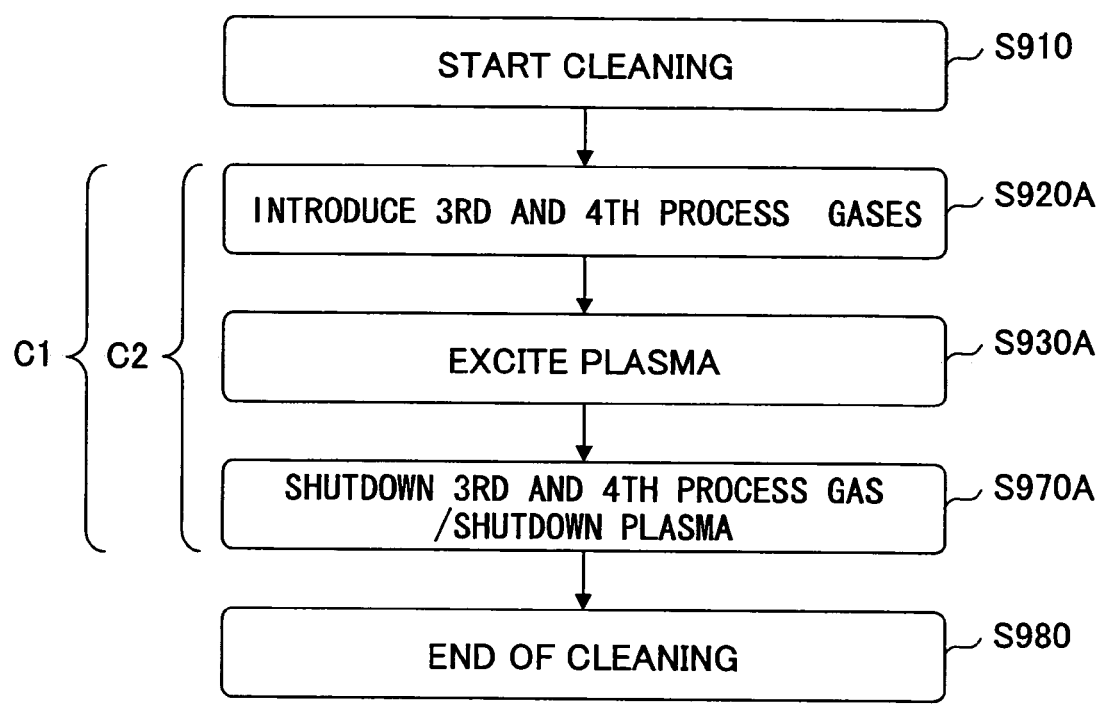

Next, a sixth embodiment of the present invention will be described with reference to FIG. 18, wherein the present embodiment is another modification of the cleaning process according to the third embodiment of the present invention. In FIG. 18, those parts corresponding to the parts explained previously are designated by the same reference numerals and the description thereof will be omitted.

Referring to FIG. 18, the present embodiment opens the valve 206A and the valve 206B in a step 920A conducted after the step 910 and the third processing gas and the fourth processing gas are introduced into the processing vessel 201 via the shower head 201B.

Thus, with the present embodiment, oxidation of the insulation film and removal of C from the insulation film proceed simultaneously to the etching process conducted by fluorine. Thereby, with the present embodiment, in which the third and fourth processing gases are introduced simultaneously, an advantageous feature that the control of the cleaning processing is simplified is attained, in addition to the advantageous effect explained with reference to the third embodiment, and the time needed for the cleaning process is reduced. Further, because the third processing gas and the fourth processing gas are introduced simultaneously, it is possible with the present embodiment to reduce the number of the gas lines and hence the cost of the substrate processing apparatus.

It should be noted that the etching rate of the insulation film containing Si and C changes depending on the composition thereof. For example, the contribution of oxidation of the insulation film or removal of C therefrom on the etching rate may increase depending on the composition of the insulation film. Thereby, there can be a case in which the etching rate increases in the event the oxidation processing step C1 is conducted in advance of the fluorine processing step C2. In this case, the cleaning time may decrease in the case of the third through fifth embodiments as compared with the present embodiment.

Thus, in view of the foregoing effect, it is preferable to choose most preferable process from the process of the third embodiment to the process of the sixth embodiment, according to the needs.

According to the present invention, it becomes possible to decrease the dielectric constant of the insulation film formed by an organic silane gas and achieve the improvement of mechanical strength at the same time.

Further, the present invention is not limited to the embodiments described heretofore, but various variations and modifications may be made without departing from the scope of the invention.

What is claimed is:

1. A method of forming a low-K dielectric film, comprising the steps of:
   depositing a low-K dielectric film on a substrate;
   placing the substrate carrying thereon the low-K dielectric film on a stage;
   heating said low-K dielectric film on said stage;
   processing said low-K dielectric film by plasma of a processing gas containing a hydrogen gas, said plasma being excited while supplying said processing gas over said low-K dielectric film;
   wherein said plasma is excited within 90 seconds after placing said substrate upon said stage, and
   wherein the substrate is heated for no more than 90 seconds between the completion of depositing the low-K dielectric film and beginning excitation of the plasma processing gas containing a hydrogen gas.

2. The method as claimed in claim 1, wherein said plasma is excited by a microwave.

3. The method as claimed in claim 2, wherein said microwave is supplied to a space where said plasma is to be excited via a planar antenna having plural slots.

4. The method as claimed in claim 2 wherein said low-K dielectric film has a specific dielectric constant of 2.5 or less.

5. The method as claimed in claim 1, wherein said plasma is excited within 30 seconds after placing said substrate upon said stage and wherein said low-K dielectric film has a specific dielectric constant of 2.3 or less.

6. The method as claimed in claim 1, wherein said step of heating said low-K dielectric film is conducted to a temperature of 300° C. or more.

7. The method as claimed in claim 1, wherein said step of heating said low-K dielectric film is conducted to a temperature of 340° C. or more.

8. The method as claimed in claim 1, wherein said plasma is excited within 10 seconds after placing said substrate upon said stage and wherein said low-K dielectric film reduces a thickness thereof within 3% with said step of plasma processing.

9. The method as claimed in claim 1, wherein said step of plasma processing is conducted at a pressure of 10 Pa or more but not exceeding 1000 Pa.

10. The method as claimed in claim 4, wherein said low-K dielectric film has a longitudinal elastic modulus of 10 GPa or more.

11. The method as claimed in claim 9, wherein said low-K dielectric film has a longitudinal elastic modulus of 10 GPa or more.

12. The method as claimed in claim 4, wherein said step of plasma processing is conducted at a pressure of 40 Pa or more but not exceeding 90 Pa.

13. The method as claimed in claim 2, wherein said microwave is supplied to a space where said plasma is to be excited through a microwave window, and wherein a distance between said microwave window and said substrate is set to 55 mm or less in said step of plasma processing.

14. The method as claimed in claim 13, wherein further comprising a step of forming said low-K dielectric film by exciting a processing gas containing an organic.

15. The method as claimed in claim 14, wherein said step of forming said low-K dielectric film is conducted by using a parallel-plate plasma processing apparatus.

16. The method as claimed in claim 14, wherein said organic silane gas comprises a trimethyl silane or dimethyl methoxy silane.

17. The method as claimed in claim 1, wherein said plasma has an electron temperature of 0.7-2 eV.

18. The method as claimed in claim 1, wherein said low-K dielectric film comprises a SiCO(H) film.

19. A method of forming a low-K dielectric film, comprising the steps of:
   forming a low-K dielectric film on a substrate by exciting a first plasma of a first processing gas containing an organic silane gas, wherein said low-K dielectric film has a first specific dielectric constant after processing with the first plasma; and
   processing said low-K dielectric film by exciting a second plasma of a processing gas containing a hydrogen gas, said second plasma being excited by supplying a second processing gas containing a hydrogen gas to a space over said substrate where said second plasma is excited, and wherein the low-K dielectric film has a second specific dielectric constant after processing with the second plasma,
   wherein said second plasma has an electron temperature of 0.7-2 eV, wherein said second specific dielectric constant is lower than said first specific dielectric constant, such that said low-K dielectric film has a specific dielectric constant which is lower after said processing with said second plasma than the specific dielectric constant after said processing with said first plasma, and wherein the substrate is treated for no more than 90 seconds between extinguishing said first plasma and beginning exciting said second plasma.

20. The method as claimed in claim 19, wherein said step of processing said low-K dielectric film with said second plasma comprises the steps of:

placing said substrate carrying said low-K dielectric film on a stage held at an elevated temperature; and exciting said second plasma within 90 seconds after placing said substrate on said stage.

\* \* \* \* \*